US012813340B2

(12) United States Patent
Jung et al.

(10) Patent No.: US 12,813,340 B2
(45) Date of Patent: Nov. 24, 2026

(54) LIGHT EMITTING ELEMENT SOLVENT AND METHOD OF FABRICATING DISPLAY DEVICE

(71) Applicant: Samsung Display Co., LTD., Yongin-si (KR)

(72) Inventors: Jae Hoon Jung, Yongin-si (KR); Dong Gyun Kim, Yongin-si (KR); Jun Bo Sim, Yongin-si (KR); Hee Yeon Yoo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 626 days.

(21) Appl. No.: 18/325,903

(22) Filed: May 30, 2023

(65) Prior Publication Data

US 2024/0170460 A1 May 23, 2024

(30) Foreign Application Priority Data

Oct. 26, 2022 (KR) ........................ 10-2022-0139088

(51) Int. Cl.
*H01L 25/075* (2006.01)
*C09D 11/033* (2014.01)
(Continued)

(52) U.S. Cl.
CPC ........... *H10W 90/00* (2026.01); *C09D 11/033* (2013.01); *C09D 11/30* (2013.01); *C09D 11/322* (2013.01);
(Continued)

(58) Field of Classification Search
None
See application file for complete search history.

(56) References Cited

U.S. PATENT DOCUMENTS

2012/0074535 A1* 3/2012 Huang .................. H10P 14/665 257/632
2018/0237649 A1* 8/2018 Pan ...................... C09D 11/322
(Continued)

FOREIGN PATENT DOCUMENTS

EP 1 142 049 A2 10/2001
WO WO 00/42672 A2 7/2000

OTHER PUBLICATIONS

Han, Jung-Gu et al; "An electrolyte additive capable of scavenging HF and PF5 enables fast charging of lithium-ion batteries in $LiPF_6$-based electrolytes"; Journal of Power Sources; 446; 220; 227366; 9pp. https://doi.org/10.1016/j.jpowsour.2019.227366.
(Continued)

*Primary Examiner* — Eli D. Strah
(74) *Attorney, Agent, or Firm* — Womble Bond Dickinson (US) LLP

(57) ABSTRACT

A light emitting element solvent and method of fabricating a display device are provided. The light emitting element solvent includes a light emitting element solvent, and light emitting elements dispersed in the light emitting element solvent and each including a plurality of semiconductor layers and an insulating film surrounding outer surfaces of the semiconductor layers, wherein the light emitting element solvent includes a solvent molecule represented by Formula 1 and an ion remover represented by Formula 2.

10 Claims, 18 Drawing Sheets

(51) Int. Cl.

| | |
|---|---|
| ***C09D 11/30*** | (2014.01) |
| ***C09D 11/322*** | (2014.01) |
| ***C09D 11/36*** | (2014.01) |
| ***C09K 11/02*** | (2006.01) |
| ***H01L 33/38*** | (2010.01) |
| ***H10D 86/40*** | (2025.01) |
| ***H10H 20/01*** | (2025.01) |
| ***H10H 20/831*** | (2025.01) |
| ***H10H 29/14*** | (2025.01) |
| ***H10W 72/00*** | (2026.01) |
| ***H10W 90/00*** | (2026.01) |
| *C09D 11/03* | (2014.01) |
| *H10H 20/819* | (2025.01) |
| *H10H 20/84* | (2025.01) |
| *H10H 20/857* | (2025.01) |

(52) U.S. Cl.

CPC .............. *C09D 11/36* (2013.01); *C09K 11/02* (2013.01); *H10D 86/441* (2025.01); *H10H 20/01* (2025.01); *H10H 20/831* (2025.01); *H10H 29/142* (2025.01); *H10W 72/0198* (2026.01); *C09D 11/03* (2013.01); *C09K 2211/10* (2013.01); *H10H 20/032* (2025.01); *H10H 20/819* (2025.01); *H10H 20/84* (2025.01); *H10H 20/857* (2025.01)

(56) References Cited

U.S. PATENT DOCUMENTS

2022/0093817 A1* 3/2022 Ko ........................ C09D 11/322
2022/0093818 A1* 3/2022 Sim ........................ C09D 11/52

OTHER PUBLICATIONS

Arathala, Parandaman et al.; “Atmospheric Decomposition of Trifluoromethanol Catalyzed by Formic Acid”; J. Phys. Chem. A; DOI: 10.1021/acs.jpca.8b09316; Nov. 14, 2018; 40pp.

* cited by examiner

LIGHT EMITTING ELEMENT SOLVENT AND METHOD OF FABRICATING DISPLAY DEVICE

CROSS-REFERENCE TO RELATED APPLICATION

This application claims priority to and the benefit of Korean Patent Application No. 10-2022-0139088 filed on Oct. 26, 2022, in the Korean Intellectual Property Office, the entire contents of which are hereby incorporated by reference.

BACKGROUND

1. Field

Embodiments of the disclosure relates to a light emitting element solvent and a method of fabricating a display device.

2. Description of the Related Art

The importance of display devices has increased with the development of multimedia. Accordingly, various types of display devices such as organic light emitting displays (OLEDs) and liquid crystal displays (LCDs) have been used.

There is a self-light emitting display device including light emitting elements as devices displaying an image of the display device. The self-light emitting display device is a light emitting element, and includes an organic light emitting display device using an organic material as a light emitting material, an inorganic light emitting display device using an inorganic material as a light emitting material, and/or the like.

SUMMARY

A display device including inorganic light emitting diodes may be fabricated through an inkjet printing process of dispersing light emitting elements having a small size in an ink and jetting the ink onto electrodes. The light emitting elements may be jetted onto the electrodes in a state in which they are dispersed in a solvent, and may be seated (e.g., deposited) on the electrodes while their positions and orientation directions are changed by an electric field generated on (or at) the electrodes.

A surface of the display device may be fluorine (F)-treated before the inkjet printing process so that the ink may be smoothly seated (e.g., deposited). When the ink is jetted onto the fluorine-treated surface, fluorine ions ($F^-$) may be eluted from the surface. The fluorine ions ($F^-$) eluted into the ink may change an electrical conductivity of the ink and lower electric field reactivity of the light emitting elements in the ink.

Aspects of embodiments of the disclosure provide a light emitting element ink including a light emitting element solvent including an ion remover capable of removing ions that may be eluted from a surface-treated surface.

Aspects of embodiments of the disclosure also provide a method of fabricating a display device using the light emitting element ink.

However, aspects of embodiments of the disclosure are not restricted to those set forth herein. The above and other aspects of embodiments of the disclosure will become more apparent to one of ordinary skill in the art to which the disclosure pertains by referencing the detailed description of the disclosure given below.

According to an embodiment of the disclosure, a light emitting element ink (e.g., a light emitting element ink composition) comprises a light emitting element solvent, and light emitting elements dispersed in the light emitting element solvent and each including a plurality of semiconductor layers and an insulating film surrounding outer surfaces of the semiconductor layers, wherein the light emitting element solvent includes a solvent molecule represented by Formula 1 and an ion remover represented by Formula 2, $R^1$—$(OH)_n$ Formula 1

$R^1$—$(O—SiR^2_3)_n$ Formula 2 wherein $R^1$ is any one selected from Formulas 3 to 5, $R^2$ is any one selected from hydrogen (H), a $C_1$-$C_{15}$ alkyl group, a $C_2$-$C_{15}$ alkylene group, a $C_2$-$C_{15}$ alkenyl group, a $C_2$-$C_{15}$ alkynyl group, a $C_1$-$C_{15}$ alkyl ether group, a $C_2$-$C_{15}$ alkenyl ether group, and

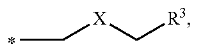

n is an integer of 1 or 2, X is a heteroatom that is any one selected from oxygen (O), nitrogen (N), sulfur (S), and phosphorus (P), $R^3$ is at least one selected from a $C_3$-$C_{13}$ alkyl group, a $C_4$-$C_{13}$ alkylene group, a $C_4$-$C_{13}$ alkenyl group, a $C_4$-$C_{13}$ alkynyl group, a $C_3$-$C_{13}$ alkyl ether group, and a $C_4$-$C_{13}$ alkenyl ether group, and Formula 3

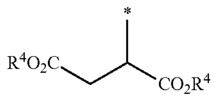

Formula 4

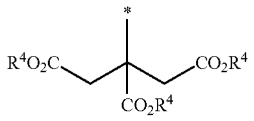

Formula 5

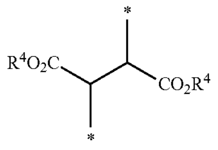

wherein $R^4$ is at least one selected from a $C_1$-$C_{15}$ alkyl group, a $C_2$-$C_{15}$ alkylene group, a $C_2$-$C_{15}$ alkenyl group, a $C_2$-$C_{15}$ alkynyl group, a $C_1$-$C_{15}$ alkyl ether group, and a $C_2$-$C_{15}$ alkenyl ether group, and '*' in Formulas 1 to 5 is a bonding site.

A viscosity of the light emitting element solvent measured at 25° C. may be in a range of 18 cp to 22 cp.

A dielectric constant of the light emitting element solvent may be in a range of 6.4 to 6.6.

An electrical conductivity of the light emitting element solvent may be in a range of 0 to 0.4 μs/m.

The ion remover may be included in an amount of 1 wt % or less with respect to 100 wt % of the light emitting element solvent.

Formula 1 may be any one selected from Formulas A1 to C1, and Formula 2 may be any one selected from Formulas A2 to C2, Formula A1

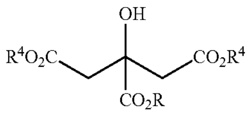

Formula B1

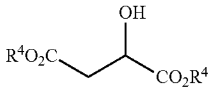

Formula C1

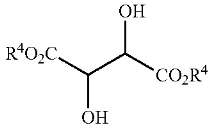

Formula A2

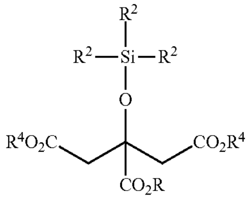

Formula B2

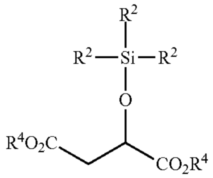

Formula C2

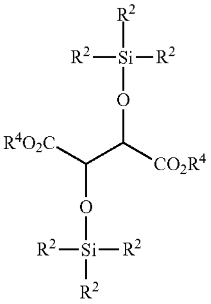

wherein $R^2$ is any one selected from hydrogen (H), a $C_1$-$C_{15}$ alkyl group, a $C_2$-$C_{15}$ alkylene group, a $C_2$-$C_{15}$ alkenyl group, a $C_2$-$C_{15}$ alkynyl group, a $C_1$-$C_{15}$ alkyl ether group, a $C_2$-$C_{15}$ alkenyl ether group, and

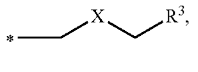

and $R^4$ is any one selected from a $C_1$-$C_{15}$ alkyl group, a $C_2$-$C_{15}$ alkylene group, a $C_2$-$C_{15}$ alkenyl group, a $C_2$-$C_{15}$ alkynyl group, a $C_1$-$C_{15}$ alkyl ether group, and a $C_2$-$C_{15}$ alkenyl ether group.

The light emitting element solvent may include at least one selected from Formulas A1 to C1 and at least one selected from Formulas A2 to C2.

The light emitting element solvent may further include at least one selected from compounds represented by Formulas D to F, and Formula D

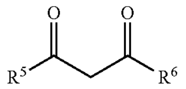

Formula E

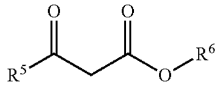

Formula F

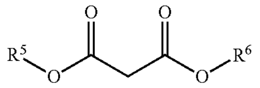

wherein $R^5$ and $R^6$ are each independently any one selected from a $C_1$-$C_{10}$ alkyl group, a $C_2$-$C_{10}$ alkenyl group, a $C_2$-$C_{10}$ alkynyl group, a $C_1$-$C_{10}$ alkyl ether group, and a $C_2$-$C_{10}$ alkenyl ether group.

The plurality of semiconductor layers may include a first semiconductor layer and a second semiconductor layer, and a light emitting layer between the first semiconductor layer and the second semiconductor layer, and the insulating film may surround at least an outer surface of the light emitting layer.

The light emitting element may have a shape in which it extends in one direction and has a length in a range of 1 μm to 5 μm.

According to an embodiment of the disclosure, a method of fabricating a display device, comprises preparing a substrate on which a first electrode and a second electrode are formed and a bank layer is formed and a light emitting element ink (e.g., a light emitting element ink composition) including light emitting elements each including a plurality of semiconductor layers and a light emitting element solvent in which the light emitting elements are dispersed, the bank layer having a surface on which a hydrophobic treatment is performed and surrounding an area in which the first electrode and the second electrode are provided, jetting the light emitting element ink onto the area surrounded by the bank layer of the substrate and generating an electric field on (or at) the first electrode and the second electrode, and providing the light emitting elements on the first electrode and the second electrode, wherein the light emitting element solvent includes a solvent molecule represented by Formula 1 and an ion remover represented by Formula 2, $R^1$—$(OH)_n$ Formula 1

$R^1$—$(O$—$SiR^2_3)_n$ Formula 2 wherein $R^1$ is any one selected from Formulas 3 to 5, $R^2$ is any one selected from hydrogen (H), a $C_1$-$C_{15}$ alkyl group, a $C_2$-$C_{15}$ alkylene group, a $C_2$-$C_{15}$ alkenyl group, a $C_2$-$C_{15}$ alkynyl group, a $C_1$-$C_{15}$ alkyl ether group, a $C_2$-$C_{15}$ alkenyl ether group, and

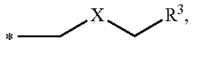

n is an integer of 1 or 2, X is a heteroatom that is any one selected from oxygen (O), nitrogen (N), sulfur (S), and phosphorus (P), $R^3$ is at least one selected from a $C_3$-$C_{13}$ alkyl group, a $C_4$-$C_{13}$ alkylene group, a $C_4$-$C_{13}$ alkenyl group, a $C_4$-$C_{13}$ alkynyl group, a $C_3$-$C_{13}$ alkyl ether group, and a $C_4$-$C_{13}$ alkenyl ether group, and Formula 3

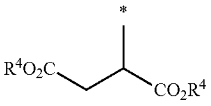

Formula 4

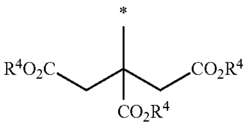

Formula 5

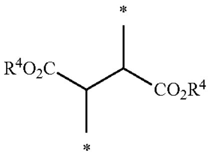

wherein $R^4$ is at least one selected from a $C_1$-$C_{15}$ alkyl group, a $C_2$-$C_{15}$ alkylene group, a $C_2$-$C_{15}$ alkenyl group, a $C_2$-$C_{15}$ alkynyl group, a $C_1$-$C_{15}$ alkyl ether group, and a $C_2$-$C_{15}$ alkenyl ether group, and '*' in Formulas 1 to 5 is a bonding site.

A viscosity of the light emitting element solvent measured at 25° C. may be in a range of 18 cp to 22 cp.

A dielectric constant of the light emitting element solvent may be in a range of 6.4 to 6.6.

An electrical conductivity of the light emitting element solvent may be in a range of 0 to 0.4 µs/m.

The ion remover may be included in an amount of 11 wt % or less with respect to 100 wt % of the light emitting element solvent.

Formula 1 may be any one selected from Formulas A1 to C1, Formula 2 may be any one selected from Formulas A2 to C2, and the light emitting element solvent may include at least one selected from Formulas A1 to C1 and at least one selected from Formulas A2 to C2, Formula A1

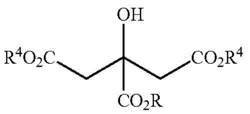

Formula B1

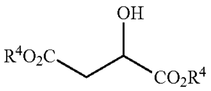

Formula C1

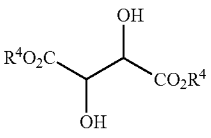

-continued

Formula A2

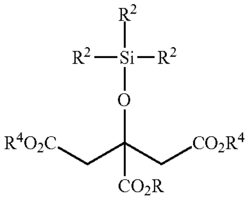

Formula B2

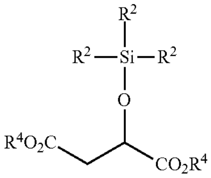

Formula C2

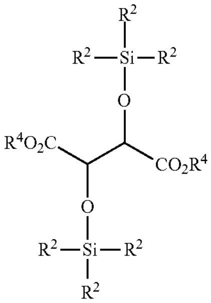

wherein $R^2$ is any one selected from hydrogen (H), a $C_1$-$C_{15}$ alkyl group, a $C_2$-$C_{15}$ alkylene group, a $C_2$-$C_{15}$ alkenyl group, a $C_2$-$C_{15}$ alkynyl group, a $C_1$-$C_{15}$ alkyl ether group, a $C_2$-$C_{15}$ alkenyl ether group, and, and $R^4$ is any one selected from a $C_1$-$C_{15}$ alkyl group, a $C_2$-$C_{15}$ alkylene group, a $C_2$-$C_{15}$ alkenyl group, a $C_2$-$C_{15}$ alkynyl group, a $C_1$-$C_{15}$ alkyl ether group, and a $C_2$-$C_{15}$ alkenyl ether group.

When the light emitting element ink is jetted, the ion remover may react with impurity ions eluted from the surface of the bank layer.

The method of fabricating a display device may further comprise providing the light emitting elements and removing the light emitting element solvent, wherein the removing of the light emitting element solvent may be performed through a heat treatment process in a temperature range of 200° C. to 400° C.

In the providing of the light emitting elements on the first electrode and the second electrode, positions and orientation directions of the light emitting elements may be changed by the electric field.

The plurality of light emitting elements may have one ends on the first electrode (e.g., may each have one end on the first electrode) and the other ends on the second electrode (e.g., may each have another end on the second electrode, the other end being opposite the one end), and may be spaced apart from each other.

In a light emitting element ink according to an embodiment, a light emitting element solvent may include an ion remover having substantially the same chemical structure as a solvent molecule. The ion remover of the light emitting element solvent may remove impurity ions unintentionally generated in processes of fabricating a display device, and may prevent or reduce a change in physical properties of the light emitting element solvent related to alignment of light emitting elements during the processes of fabricating the display device. According to an embodiment, the light emitting element ink may prevent or reduce a decrease in alignment degree of the light emitting elements due to a change in physical properties of the light emitting element solvent in the processes of fabricating the display device.

The effects of the disclosure are not limited to the aforementioned effects, and various suitable other effects are included in the specification.

BRIEF DESCRIPTION OF THE DRAWINGS

The above and other aspects and features of embodiments of the disclosure will become more apparent by describing in more detail embodiments thereof with reference to the attached drawings, in which.

DETAILED DESCRIPTION

The subject matter of the present disclosure will now be described more fully hereinafter with reference to the accompanying drawings, in which example embodiments of the present disclosure are shown. The subject matter of this disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the spirit and scope of the present disclosure. Similarly, the second element could also be termed the first element.

Hereinafter, embodiments will be described with reference to the accompanying drawings.

Figure 1:
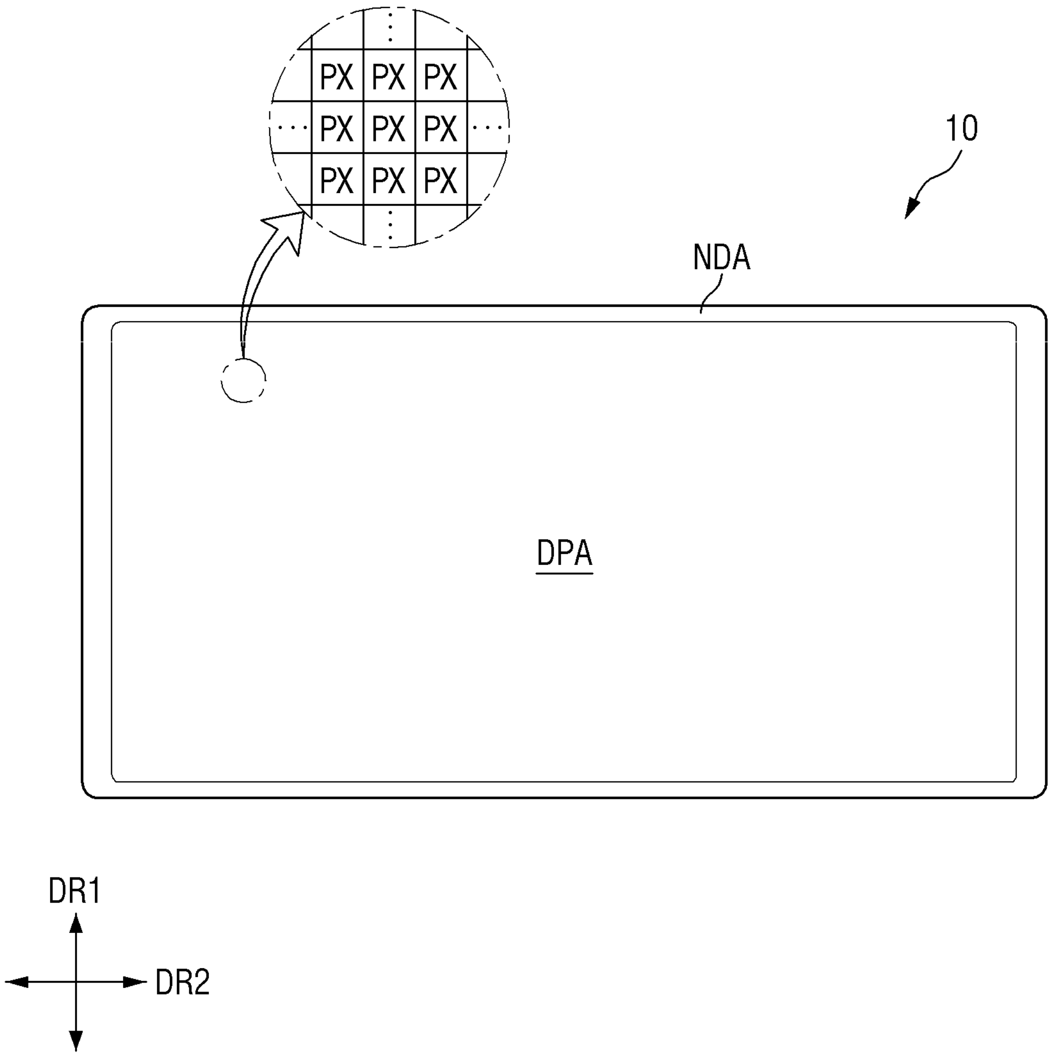
FIG. 1 is a schematic plan view of a display device according to an embodiment.

FIG. 1 is a schematic plan view of a display device according to an embodiment.

Referring to FIG. 1, a display device 10 displays a moving image and/or a still image. The display device 10 may refer to all electronic devices that provide display screens. For example, televisions, laptop computers, monitors, billboards, an Internet of Things (IoT) device, mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras, camcorders, and/or the like, which provide display screens, may be included in the display device 10.

The display device 10 includes a display panel providing the display screen. Examples of the display panel may include an inorganic light emitting diode display panel, an organic light emitting display panel, a quantum dot light emitting display panel, a plasma display panel, a field emission display panel, and/or the like. Hereinafter, a case where an inorganic light emitting diode display panel is applied as an example of the display panel will be described by way of example, but the disclosure is not limited thereto, and the same technical spirit may be applied to other display panels if applicable.

A shape of the display device 10 may be variously modified. For example, the display device 10 may have a shape such as a rectangular shape having a width greater than a length, a rectangular shape having a length greater than a width, a square shape, a rectangular shape having rounded corners (vertices), other polygonal shapes, or a circular shape. A shape of a display area DPA of the display device 10 may also be similar to an overall shape of the display device 10. In FIG. 1, the display device 10 having a rectangular shape having a greater length in a second direction DR2 is illustrated.

The display device 10 may include a display area DPA and non-display areas NDA. The display area DPA is an area in which a screen (e.g., an image) may be displayed, and the non-display area NDA is an area in which the screen (e.g., the image) is not displayed. The display area DPA may also be referred to as an active area, and the non-display area NDA may also be referred to as a non-active area. The display area DPA may occupy substantially the center of the display device 10.

The display area DPA may include a plurality of pixels PX. The plurality of pixels PX may be arranged in a matrix direction. A shape of each pixel PX may be a rectangular shape or a square shape in a plan view, but is not limited thereto, and may also be a rhombic shape of which each side is inclined with respect to one direction. The respective pixels PX may be arranged in a stripe type and/or an island type. In addition, each of the pixels PX may include one or more light emitting elements emitting light of a set or specific wavelength band to display a set or specific color.

The non-display areas NDA may be around the display area DPA. The non-display areas NDA may entirely or partially surround the display area DPA. The display area DPA may have a rectangular shape, and the non-display areas NDA may be adjacent to four sides of the display area DPA. The non-display areas NDA may constitute a bezel of the display device 10. Lines and/or circuit drivers included in the display device 10 may be provided and/or external devices may be mounted, in each of the non-display areas NDA.

Figure 2:
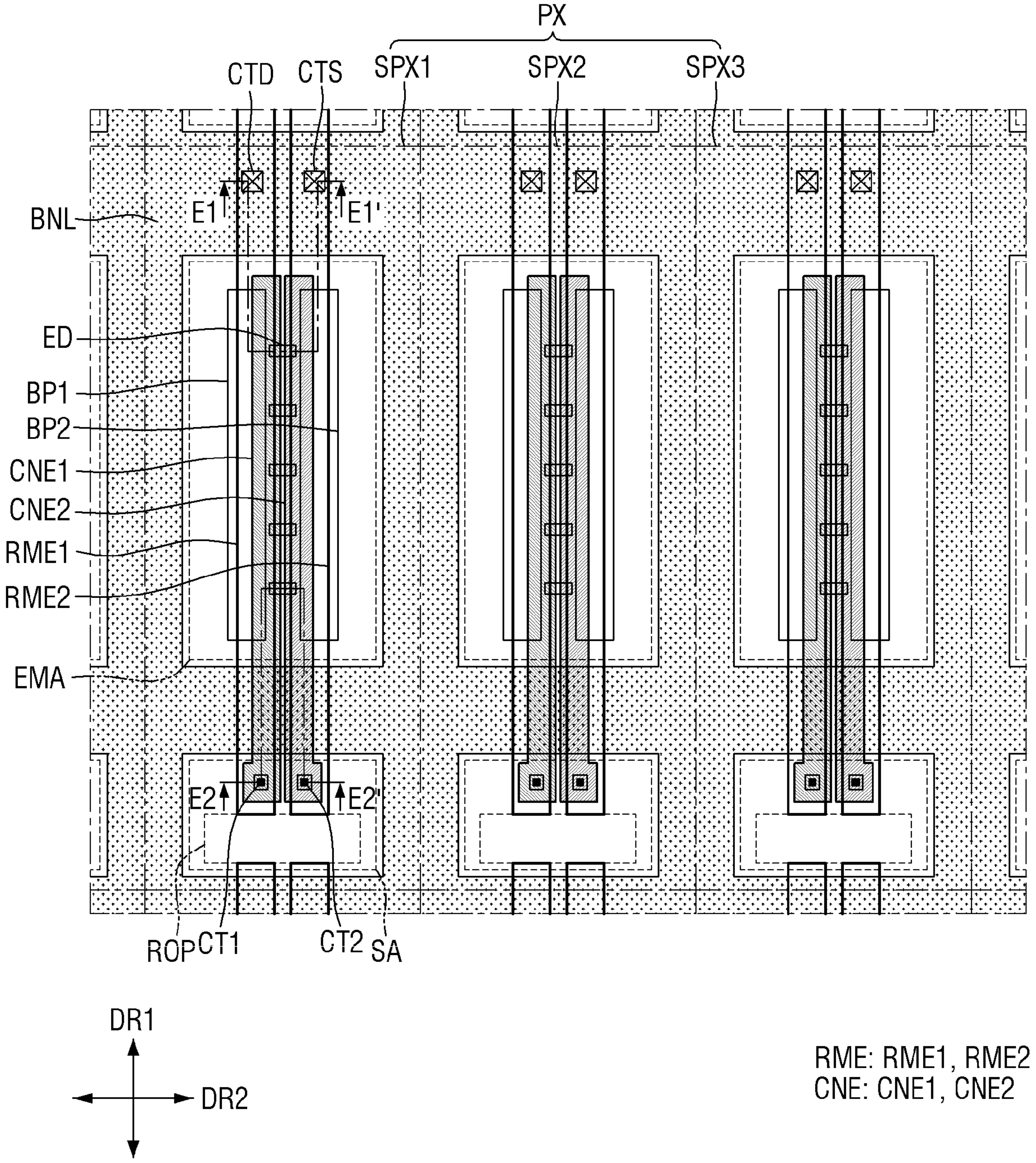
FIG. 2 is a plan view illustrating one pixel of the display device according to an embodiment.

FIG. 2 is a plan view illustrating one pixel of the display device according to an embodiment.

FIG. 2 illustrates a layout, in a plan view, of electrodes RME: RME1 and RME2, walls BP1 and BP2, a bank layer BNL, a plurality of light emitting elements ED, and connection electrodes CNE: CNE1 and CNE2 in one pixel PX of the display device 10.

Referring to FIG. 2, each of the pixels PX of the display device 10 may include a plurality of sub-pixels SPXn. For example, one pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. As an example, the first color may be blue, the second color may be green, and the third color may be red. However, the disclosure is not limited thereto, and the respective sub-pixels SPXn may also emit light of the same color. In an embodiment, the respective sub-pixels SPXn may emit blue light. It has been illustrated in FIG. 2 that one pixel PX includes three sub-pixels SPXn, but the disclosure is not limited thereto, and the pixel PX may include a larger number of sub-pixels SPXn.

Each of the sub-pixels SPXn of the display device 10 may include an emission area EMA and a non-emission area. The emission area EMA may be an area in which light emitting elements ED are provided to emit light of a set or specific wavelength band. The non-emission area may be an area in which the light emitting elements ED are not provided and light emitted from the light emitting elements ED does not arrive, and thus, the light is not emitted.

The emission area EMA may include an area in which the light emitting elements ED are provided and an area which is adjacent to the light emitting elements ED and in which the light emitted from the light emitting elements ED is emitted. For example, the emission area EMA may also include an area in which the light emitted from the light emitting elements ED is reflected or refracted by other members and then emitted. A plurality of light emitting elements ED may be in each sub-pixel SPXn, and an emission area including an area in which the plurality of light emitting elements ED are provided and an area adjacent to the plurality of light emitting elements ED may be formed.

It has been illustrated in FIG. 2 that the emission areas EMA of the respective sub-pixels SPXn have a uniform (or substantially uniform) area, but the disclosure is not limited thereto. In some embodiments, the respective emission areas EMA of the respective sub-pixels SPXn may also have different areas depending on colors or wavelength bands of light emitted from the light emitting elements ED in the corresponding sub-pixels.

Each sub-pixel SPXn may further include a sub-area SA in the non-emission area. The sub-area SA of the corresponding sub-pixel SPXn may be on the lower side of the emission area EMA, which is the other side of the emission area EMA in a first direction DR1. The emission areas EMA and the sub-areas SA may be alternately arranged along the first direction DR1, and the sub-area SA may be between the emission areas EMA of different sub-pixels SPXn spaced apart from each other in the first direction DR1. For example, the emission areas EMA and the sub-areas SA may be alternately arranged in the first direction DR1, and each of the emission areas EMA and the sub-areas SA may be repeatedly arranged in the second direction DR2. However, the disclosure is not limited thereto, and the emission areas EMA and the sub-areas SA of the plurality of pixels PX may also have an arrangement different from that of FIG. 2.

Light is not emitted in the sub-areas SA because the light emitting elements ED are not in the sub-areas SA, but portions of electrodes RME in each of the sub-pixels SPXn may be in the sub-areas SA. The electrodes RME in different sub-pixels SPXn may be spaced apart from each other in a separation part ROP of the sub-area SA.

The display device 10 may include a plurality of electrodes RME: RME1 and RME2, the walls BP1 and BP2, the bank layer BNL, the light emitting elements ED, and the connection electrodes CNE: CNE1 and CNE2.

A plurality of walls BP1 and BP2 may be in the emission area EMA of each sub-pixel SPXn. The walls BP1 and BP2 may have a shape in which they extend in the first direction DR1, and may be spaced apart from each other in the second direction DR2.

For example, the walls BP1 and BP2 may include a first wall BP1 and a second wall BP2 spaced apart from each other in the second direction DR2 within the emission area EMA of each sub-pixel SPXn. The first wall BP1 may be on the left side, which is one side of the center of the emission area EMA in the second direction DR2, and the second wall BP2 may be spaced apart from the first wall BP1 and be on the right side, which is the other side of the center of the emission area EMA in the second direction DR2. The first walls BP1 and the second walls BP2 may be alternately provided along the second direction DR2 and be in an island-shaped pattern in the display area DPA. The light emitting elements ED may be between the first wall BP1 and the second wall BP2.

Lengths of the first wall BP1 and the second wall BP2 in the first direction DR1 may be the same as each other, but may be smaller than a length, in the first direction DR1, of the emission area EMA surrounded by the bank layer BNL. The first wall BP1 and the second wall BP2 may be spaced apart from portions of the bank layer BNL extending in the second direction DR2. However, the disclosure is not limited thereto, and the walls BP1 and BP2 may also be integrated with the bank layer BNL or partially overlap portions of the bank layer BNL extending in the second direction DR2. In this case, lengths of the walls BP1 and BP2 in the first direction DR1 may be the same as or greater than the length, in the first direction DR1, of the emission area EMA surrounded by the bank layer BNL.

It has been illustrated in FIG. 2 that two walls BP1 and BP2 are provided for each sub-pixel SPXn, but the disclosure is not limited thereto. The number and a shape of walls BP1 and BP2 may be changed depending on the number and/or arrangement structures of electrodes RME.

The plurality of electrodes RME: RME1 and RME2 have a shape in which they extend in one direction, and are provided for each sub-pixel SPXn. The plurality of electrodes RME1 and RME2 may extend in the first direction DR1 to be in the emission area EMA and the sub-area SA of the sub-pixel SPXn, and may be spaced apart from each other in the second direction DR2. The plurality of electrodes RME may be electrically connected to light emitting elements ED to be further described herein below. However, the disclosure is not limited thereto, and the electrodes RME may also not be electrically connected to the light emitting elements ED.

The display device 10 may include a first electrode RME1 and a second electrode RME2 in each sub-pixel SPXn. The first electrode RME1 is on the left side of the center of the emission area EMA, and the second electrode RME2 is spaced apart from the first electrode RME1 in the second direction DR2 and on the right side of the center of the emission area EMA. The first electrode RME1 may be on the first wall BP1, and the second electrode RME2 may be on the second wall BP2. The first electrode RME1 and the second electrode RME2 may be partially in the corresponding sub-pixel SPXn and the sub-area SA beyond the bank layer BNL. The first electrodes RME1 and the second electrodes RME2 of different sub-pixels SPXn may be spaced apart or separated from each other in the separation part ROP positioned in the sub-area SA of any one sub-pixel SPXn.

It has been illustrated in FIG. 2 that two electrodes RME have a shape in which they extend in the first direction DR1 for each sub-pixel SPXn, but the disclosure is not limited thereto. For example, in the display device 10, a larger number of electrodes RME may be in one sub-pixel SPXn or the electrodes RME may have a shape in which they are partially bent and have different widths depending on their positions.

The bank layer BNL may surround the plurality of sub-pixels SPXn, the emission areas EMA, and the sub-areas SA. The bank layer BNL may be at boundaries between the sub-pixels SPXn adjacent to each other in the first direction DR1 and the second direction DR2, and may also be at boundaries between the emission areas EMA and the sub-areas SA. The sub-pixels SPXn, the emission areas EMA, and the sub-areas SA of the display device 10 may be areas divided by an arrangement of the bank layer BNL. Intervals between the plurality of sub-pixels SPXn, the emission areas EMA, and the sub-areas SA may be changed depending on a width of the bank layer BNL.

The bank layer BNL may be in a lattice-shaped pattern in the entirety of the display area DPA by including portions extending in the first direction DR1 and the second direction DR2 in a plan view. The bank layer BNL may be provided across boundaries between the respective sub-pixels SPXn to divide neighboring sub-pixels SPXn. In addition, the bank layer BNL may surround the emission area EMA and the sub-area SA provided for each sub-pixel SPXn to divide the emission area EMA and the sub-area SA.

The plurality of light emitting elements ED may be in the emission area EMA. The light emitting elements ED may be between the walls BP1 and BP2 and be arranged to be spaced apart from each other in the first direction DR1. In an embodiment, the plurality of light emitting elements ED may have a shape in which they extend in one direction, and have both ends each on different electrodes RME. The light emitting elements ED may have a length greater than an interval between the electrodes RME spaced apart from each other in the second direction DR2. The light emitting elements ED may be arranged so that an extension direction thereof is substantially perpendicular to the first direction DR1 in which the electrodes RME extend. However, the disclosure is not limited thereto, and the light emitting elements ED may be provided so that the extension direction thereof is the second direction DR2 or a direction obliquely inclined with respect to the second direction DR2.

A plurality of connection electrodes CNE: CNE1 and CNE2 may be on the plurality of electrodes RME and the walls BP1 and BP2. The plurality of connection electrodes CNE may each have a shape in which they extend in one direction, and may be spaced apart from each other. Each of the connection electrodes CNE may be in contact with the light emitting elements ED and be electrically connected to the electrode RME and lower conductive layers.

The connection electrodes CNE may include a first connection electrode CNE1 and a second connection electrode CNE2 in each sub-pixel SPXn. The first connection electrode CNE1 may have a shape in which it extends in the first direction DR1, and may be on the first electrode RME1 or the first wall BP1. The first connection electrode CNE1 may partially overlap the first electrode RME1, and may be provided from the emission area EMA to the sub-area SA beyond the bank layer BNL. The second connection electrode CNE2 may have a shape in which it extends in the first direction DR1, and may be on the second electrode RME2 or the second wall BP2. The second connection electrode CNE2 may partially overlap the second electrode RME2, and may be provided from the emission area EMA to the sub-area SA beyond the bank layer BNL.

Figure 3:
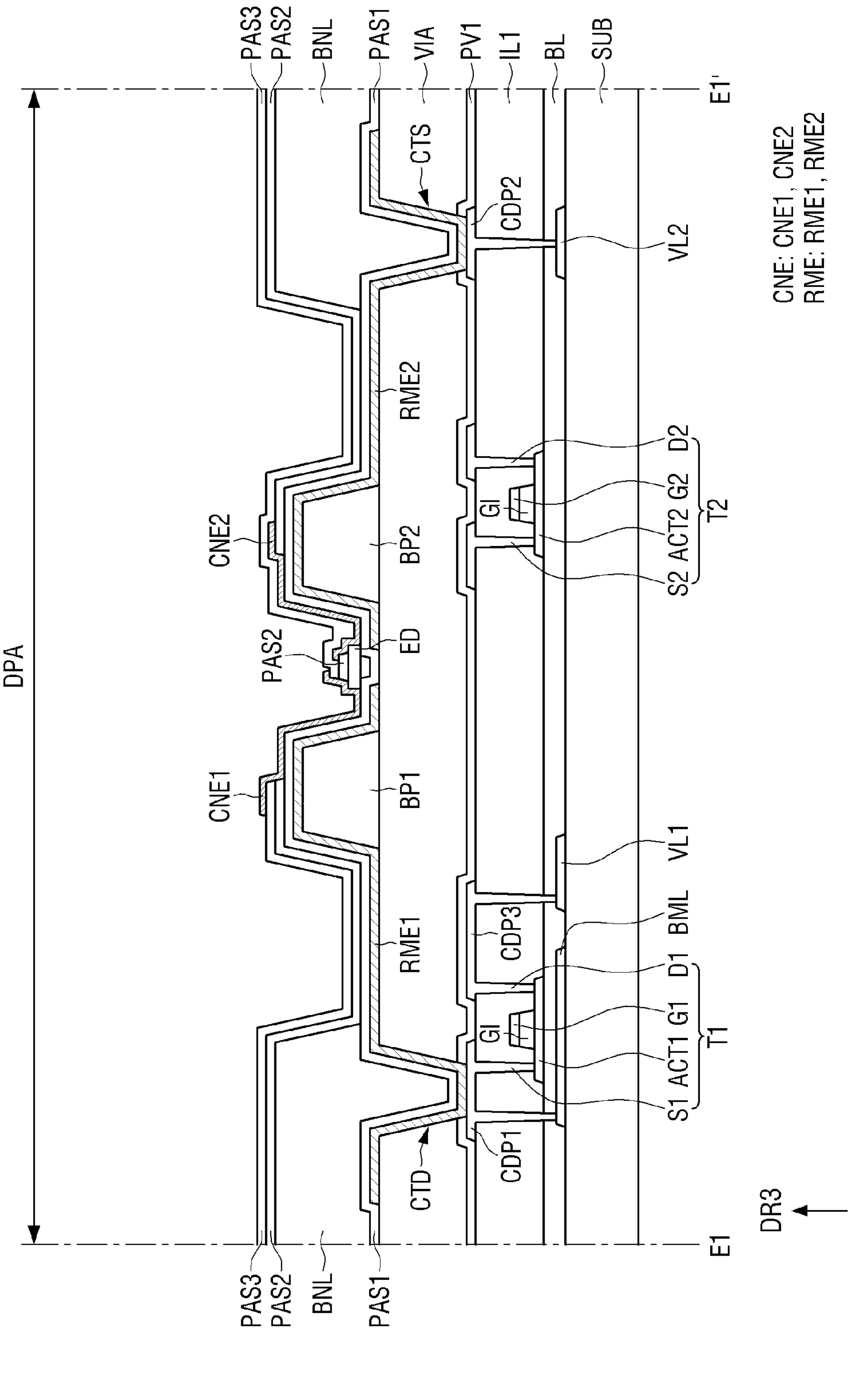
FIG. 3 is a cross-sectional view taken along line E1-E1' of FIG. 2.
Figure 4:
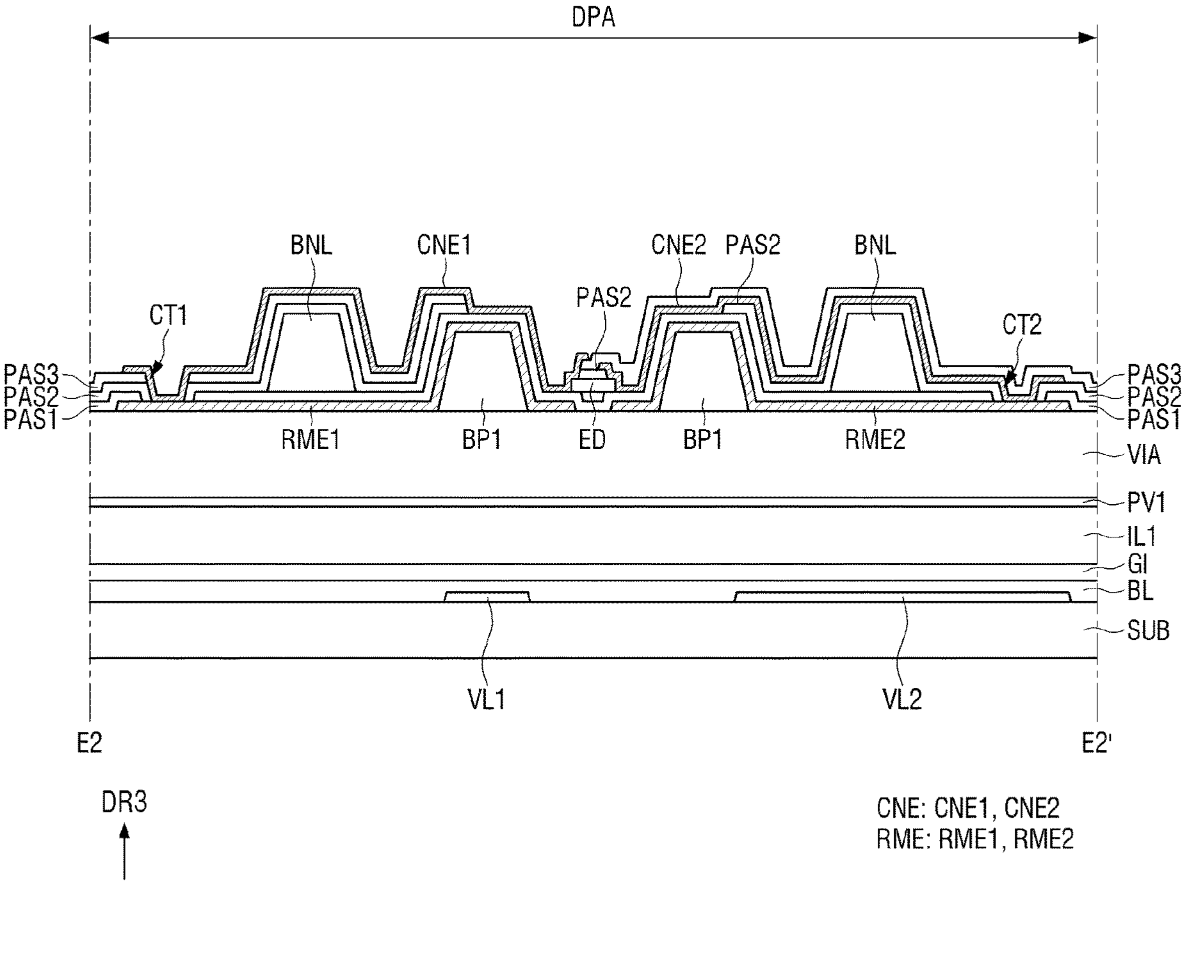
FIG. 4 is a cross-sectional view taken along line E2-E2' of FIG. 2.

FIG. 3 is a cross-sectional view taken along line E1-E1' of FIG. 2. FIG. 4 is a cross-sectional view taken along line E2-E2' of FIG. 2.

FIG. 3 illustrates a cross section crossing both ends of the light emitting element ED and electrode contact holes CTD and CTS in the first sub-pixel SPX1, and FIG. 4 illustrates a cross section crossing both ends of the light emitting element ED and contact parts CT1 and CT2 in the first sub-pixel SPX1.

A cross-sectional structure of the display device 10 will be described with reference to FIGS. 3-4 in conjunction with FIG. 2. The display device 10 may include a first substrate SUB, and a semiconductor layer, a plurality of conductive layers, and a plurality of insulating layers on the first substrate SUB. In addition, the display device 10 may include the plurality of electrodes RME: RME1 and RME2, the light emitting elements ED, and the connection electrodes CNE: CNE1 and CNE2.

The first substrate SUB may be an insulating substrate. The first substrate SUB may be made of an insulating material such as glass, quartz, and/or a polymer resin. In addition, the first substrate SUB may be a rigid substrate, but may also be a flexible substrate that may be bent, folded, and/or rolled. The first substrate SUB may include a display area DPA and a non-display area NDA surrounding the display area DPA, and the display area DPA may include an emission area EMA and a sub-area SA, which is a portion of a non-emission area.

A first conductive layer may include a lower metal layer BML, a first voltage line VL1, and a second voltage line VL2. The lower metal layer BML is provided to overlap a first active layer ACT1 of a first transistor T1. The lower metal layer BML may prevent or reduce incidence of light on the first active layer ACT1 of the first transistor or may be electrically connected to the first active layer ACT1 to serve to stabilize electrical characteristics of the first transistor T1. However, the lower metal layer BML may be omitted.

A high potential voltage (or a first source voltage) transferred to a first electrode RME1 may be applied to the first voltage line VL1, and a low potential voltage (or a second source voltage) transferred to a second electrode RME2 may be applied to the second voltage line VL2. The first voltage line VL1 may be electrically connected to the first transistor T1 through a conductive pattern (e.g., a third conductive pattern CDP3) of a third conductive layer. The second voltage line VL2 may be electrically connected to the second electrode RME2 through a conductive pattern (e.g., a second conductive pattern CDP2) of the third conductive layer.

It has been illustrated in FIGS. 3-4 that the first voltage line VL1 and the second voltage line VL2 are provided at the first conductive layer, but the disclosure is not limited thereto. In some embodiments, the first voltage line VL1 and the second voltage line VL2 may be provided at the third conductive layer and be directly electrically connected to the first transistor T1 and the second electrode RME2, respectively.

A buffer layer BL may be on the first conductive layer and the first substrate SUB. The buffer layer BL may be formed on the first substrate SUB in order to protect transistors of the pixel PX from moisture permeating through the first substrate SUB vulnerable to moisture permeation, and may perform a surface planarization function.

The semiconductor layer is on the buffer layer BL. The semiconductor layer may include the first active layer ACT1 of the first transistor T1 and a second active layer ACT2 of a second transistor T2. The first active layer ACT1 and the second active layer ACT2 may partially overlap a first gate electrode G1 and a second gate electrode G2 of a second conductive layer to be further described herein below, respectively.

The semiconductor layer may include polycrystalline silicon, single crystal silicon, an oxide semiconductor, or the like. In another embodiment, the semiconductor layer may include polycrystalline silicon. The oxide semiconductor may be an oxide semiconductor containing indium (In). For example, the oxide semiconductor may be at least one selected from indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

It has been illustrated in FIG. 3 that one first transistor T1 and one second transistor T2 are in the sub-pixel SPXn of the display device 10, but the disclosure is not limited thereto, and the display device 10 may include a larger number of transistors.

A first gate insulating layer GI is on the semiconductor layer and the buffer layer BL in the display area DPA. The first gate insulating layer GI may not be in a non-display area NDA. The first gate insulating layer GI may serve as a gate insulating film of each of the transistors T1 and T2. It has been illustrated in FIG. 4 that the first gate insulating layer GI is entirely on the buffer layer BL, but the disclosure is not limited thereto. In some embodiments, the first gate insulating layer GI may be patterned together with gate electrodes G1 and G2 of a second conductive layer to be described below to be partially between the second conductive layer and the active layers ACT1 and ACT2 of the semiconductor layer.

The second conductive layer is on the first gate insulating layer GI. The second conductive layer may include the first gate electrode G1 of the first transistor T1 and the second gate electrode G2 of the second transistor T2. The first gate electrode G1 may overlap a channel region of the first active layer ACT1 in a third direction DR3, which is a thickness direction, and the second gate electrode G2 may overlap a channel region of the second active layer ACT2 in the third direction DR3, which is the thickness direction. In one or more embodiments, the second conductive layer may further include one electrode of a storage capacitor.

A first interlayer insulating layer IL1 is on the second conductive layer. The first interlayer insulating layer IL1 may function as an insulating film (e.g., an electrically insulating film) between the second conductive layer and other layers on the second conductive layer, and protect the second conductive layer.

The third conductive layer is on the first interlayer insulating layer IL1. The third conductive layer may include a plurality of conductive patterns CDP1, CDP2, and CDP3 and source electrodes S1 and S2 and drain electrodes D1 and D2 of the respective transistors T1 and T2. Some of the conductive patterns CDP1, CDP2, and CDP3 may electrically connect conductive layers and/or semiconductor layers of different layers to each other, and serve as source/drain electrodes of the transistors T1 and T2.

A first conductive pattern CDP1 may be in contact with the first active layer ACT1 of the first transistor T1 through a contact hole penetrating through the first interlayer insulating layer IL1. The first conductive pattern CDP1 may be in contact with the lower metal layer BML through a contact hole penetrating through the first interlayer insulating layer IL1 and the buffer layer BL. The first conductive pattern CDP1 may serve as a first source electrode S1 of the first transistor T1. The first conductive pattern CDP1 may be electrically connected to the first electrode RME1 or the first connection electrode CNE1. The first transistor T1 may transfer the first source voltage applied from the first voltage line VL1 to the first electrode RME1 or the first connection electrode CNE1.

The second conductive pattern CDP2 may be in contact with the second voltage line VL2 through a contact hole penetrating through the first interlayer insulating layer IL1 and the buffer layer BL. The second conductive pattern CDP2 may be electrically connected to the second electrode RME2 or the second connection electrode CNE2. The second voltage line VL2 may transfer the second source voltage to the second electrode RME2 or the second connection electrode CNE2.

The third conductive pattern CDP3 may be in contact with the first voltage line VL1 through a contact hole penetrating through the first interlayer insulating layer IL1 and the buffer layer BL. In addition, the third conductive pattern CDP3 may be in contact with the first active layer ACT1 of the first transistor T1 through a contact hole penetrating through the first interlayer insulating layer IL1. The third conductive pattern CDP3 may electrically connect the first voltage line VL1 to the first transistor T1, and serve as a first drain electrode D1 of the first transistor T1.

A second source electrode S2 and a second drain electrode D2 may be in contact with the second active layer ACT2 of the second transistor T2 through contact holes penetrating through the first interlayer insulating layer IL1, respectively. The second transistor T2 may transfer a data signal to the first transistor T1 or transfer an initialization signal.

A first passivation layer PV1 is on the third conductive layer. The first passivation layer PV1 may function as an insulating film between the third conductive layer and other layers and protect the third conductive layer.

Each of the buffer layer BL, the first gate insulating layer GI, the first interlayer insulating layer IL1, and the first passivation layer PV1 described above may be formed as a plurality of inorganic layers that are alternately stacked. For example, each of the buffer layer BL, the first gate insulating layer GI, the first interlayer insulating layer IL1, and the first passivation layer PV1 may be formed as a double layer in which inorganic layers including at least one selected from silicon oxide ($SiO_x$), silicon nitride ($SiN_x$), and silicon oxynitride ($SiO_xN_y$) are stacked or a plurality of layers in which these layers are alternately stacked. However, the disclosure is not limited thereto, and each of the buffer layer BL, the first gate insulating layer GI, the first interlayer insulating layer IL1, and the first passivation layer PV1 may also be formed as one inorganic layer including the above-described insulating material. In addition, in some embodiments, the first interlayer insulating layer IL1 may also be made of an organic insulating material such as polyimide (PI).

A via layer VIA is on the third conductive layer in the display area DPA. The via layer VIA may include an organic insulating material, for example, an organic insulating material such as polyimide (PI) to compensate for a step due to lower conductive layers and make an upper surface flat. However, in some embodiments, the via layer VIA may be omitted.

The display device 10 may include the walls BP1 and BP2, the plurality of electrodes RME: RME1 and RME2, the bank layer BNL, the plurality of light emitting elements ED, and the plurality of connection electrodes CNE: CNE1 and CNE2, as a display element layer on the via layer VIA. In addition, the display device 10 may include a plurality of insulating layers PAS1, PAS2, and PAS3.

The walls BP1 and BP2 may be on the via layer VIA. For example, the walls BP1 and BP2 may be directly on the via layer VIA, and may have a structure in which at least portions thereof protrude from an upper surface of the via layer VIA. However, the disclosure is not limited thereto. The walls BP1 and BP2 may not be directly on the via layer VIA. The protruding portions of the walls BP1 and BP2 may have side surfaces inclined or bent with a set or predetermined curvature, and light emitted from the light emitting elements ED may be reflected by the electrodes RME on the walls BP1 and BP2 and then emitted in an upward direction of the via layer VIA. In one or more embodiments, the walls BP1 and BP2 may have a shape of which outer surfaces are bent with a set or predetermined curvature in cross-sectional view, for example, a semi-circular or semi-elliptical shape. The walls BP1 and BP2 may include an organic insulating material such as polyimide (PI), but are not limited thereto.

The plurality of electrodes RME: RME1 and RME2 may be on the walls BP1 and BP2 and the via layer VIA. For example, the first electrode RME1 and the second electrode RME2 may be on at least the inclined side surfaces of the walls BP1 and BP2, respectively. Widths of the plurality of electrodes RME measured in the second direction DR2 may be smaller than widths of the walls BP1 and BP2 measured in the second direction DR2, and an interval between the first electrode RME1 and the second electrode RME2 spaced apart from each other in the second direction DR2 may be smaller than an interval between the walls BP1 and BP2. At least partial areas of the first electrode RME1 and the second electrode RME2 may be directly on the via layer VIA, such that the first electrode RME1 and the second electrode RME2 may be on the same (or substantially the same) plane.

The light emitting elements ED between the walls BP1 and BP2 may emit light toward both ends thereof, and the emitted light may be directed to the electrodes RME on the walls BP1 and BP2. The respective electrodes RME may have a structure in which portions thereof on the walls BP1 and BP2 may reflect the light emitted from the light emitting elements ED. The first electrode RME1 and the second electrode RME2 may cover at least one side surfaces of the walls BP1 and BP2 to reflect the light emitted from the light emitting elements ED.

The electrodes RME may be in direct contact with the third conductive layer through the electrode contact holes CTD and CTS at portions thereof overlapping the bank layer BNL between the emission area EMA and the sub-area SA. A first electrode contact hole CTD may be formed in an area in which the bank layer BNL and the first electrode RME1 overlap each other, and a second electrode contact hole CTS may be formed in an area in which the bank layer BNL and the second electrode RME2 overlap each other. The first electrode RME1 may be in contact with the first conductive pattern CDP1 through the first electrode contact hole CTD penetrating through the via layer VIA and the first passivation layer PV1. The second electrode RME2 may be in contact with the second voltage line VL2 through the second electrode contact hole CTS penetrating through the via layer VIA and the first passivation layer PV1. The first electrode RME1 may be electrically connected to the first transistor T1 through the first conductive pattern CDP1 to receive the first source voltage applied thereto, and the second electrode RME2 may be electrically connected to the second voltage line VL2 to receive the second source voltage applied thereto. However, the disclosure is not limited thereto. In another embodiment, the respective electrodes RME1 and RME2 may not be electrically connected to the voltage lines VL1 and VL2 of the third conductive layer, and connection electrodes CNE to be further described herein below may be directly connected to the third conductive layer.

The electrodes RME may include a conductive material (e.g., an electrically conductive material) having high reflectivity. For example, the electrodes RME may include a metal such as silver (Ag), copper (Cu), or aluminum (Al), include an alloy including aluminum (Al), nickel (Ni), lanthanum (La), and/or the like, or have a structure in which a metal layer made of titanium (Ti), molybdenum (Mo), and/or niobium (Nb) and the alloy are stacked. In some embodiments, the electrodes RME may be formed as a double layer or a plurality of layers in which an alloy including aluminum (Al) and one or more metal layers made of titanium (Ti), molybdenum (Mo), and/or niobium (Nb) are stacked.

The disclosure is not limited thereto, and each of the electrodes RME may further include a transparent conductive material (e.g., a transparent electrically conductive material). For example, each of the electrodes RME may include a material such as ITO, IZO, and/or ITZO. In some embodiments, each of the electrodes RME may have a structure in which one or more layers made of a transparent conductive material (e.g., a transparent electrically conductive material) and one or more layers made of a metal having high reflectivity are stacked or may be formed as one layer including the transparent conductive material and the metal having the high reflectivity. For example, each of the electrodes RME may have a stacked structure such as ITO/Ag/ITO, ITO/Ag/IZO, or ITO/Ag/ITZO/IZO. The electrodes RME may reflect some of the light emitted from the light emitting elements ED in an upward direction of the first substrate SUB while being electrically connected to the light emitting elements ED.

A first insulating layer PAS1 may be in the entirety of the display area DPA, and may be on the via layer VIA and the plurality of electrodes RME. The first insulating layer PAS1 may insulate different electrodes RME from each other while protecting the plurality of electrodes RME. The first insulating layer PAS1 covers the electrodes RME before the bank layer BNL is formed, and may thus prevent or reduce damage to the electrodes RME in a process of forming the bank layer BNL. In addition, the first insulating layer PAS1 may prevent or reduce direct contact of the light emitting elements ED on the first insulating layer PAS1 other members with and may prevent or reduce damage to the light emitting elements ED by other members.

In an embodiment, the first insulating layer PAS1 may have a step formed so that a portion of an upper surface thereof is recessed between the electrodes RME spaced apart from each other in the second direction DR2. The light emitting elements ED may be on the upper surface of the first insulating layer PAS1 in which the step is formed, and spaces may be formed between the light emitting elements ED and the first insulating layer PAS1.

The first insulating layer PAS1 may include contact parts CT1 and CT2 in the sub-area SA. The contact parts CT1 and CT2 may overlap different electrodes RME, respectively. For example, the first insulating layer PAS1 may include first contact parts CT1 that overlap the first electrode RME1 and second contact parts CT2 that overlap the second electrode RME2. The first contact parts CT1 and the second contact parts CT2 may penetrate through the first insulating layer PAS1 to expose, respectively, portions of upper surfaces of the first electrode RME1 and the second electrode RME2 below the first insulating layer PAS1. The first contact part CT1 and the second contact part CT2 may further penetrate through portions of the other insulating layers on the first insulating layer PAS1, respectively. The electrodes RME exposed by the respective contact parts CT1 and CT2 may be in contact with the connection electrodes CNE.

The bank layer BNL may be on the first insulating layer PAS1. The bank layer BNL may include portions extending in the first direction DR1 and the second direction DR2, and surround each of the sub-pixels SPXn. The bank layer BNL may divide the emission area EMA and the sub-area SA of each sub-pixel SPXn while surrounding the emission area EMA and the sub-area SA of each sub-pixel SPXn, and may divide the display area DPA and the non-display area NDA while surrounding the outermost portion of the display area DPA.

The bank layer BNL may have a set or predetermined height, similar to the walls BP1 and BP2. In some embodiments, a height of an upper surface of the bank layer BNL may be greater than that of the walls BP1 and BP2, and a thickness of the bank layer BNL may be the same as or greater than that of the walls BP1 and BP2. The bank layer BNL may prevent or reduce overflow of an ink into adjacent sub-pixels SPXn in an inkjet printing process of processes of fabricating the display device 10. The bank layer BNL may include an organic insulating material such as polyimide like the walls BP1 and BP2.

The light emitting elements ED may be in the emission area EMA. The light emitting elements ED may be on the first insulating layer PAS1 between the walls BP1 and BP2. The light emitting element ED may be provided so that one direction in which it extends is parallel (or substantially parallel) to an upper surface of the first substrate SUB. As further described herein below, the light emitting element ED may include a plurality of semiconductor layers provided along one direction in which it extends, and the plurality of semiconductor layers may be sequentially provided along a direction parallel (or substantially parallel) to the upper surface of the first substrate SUB. However, the disclosure is not limited thereto, and when the light emitting element ED has a different structure, the plurality of semiconductor layers may also be provided in a direction perpendicular (or substantially perpendicular) to the first substrate SUB.

The light emitting elements ED in each sub-pixel SPXn may emit light of different wavelength bands depending on materials of the above-described semiconductor layers. However, the disclosure is not limited thereto, and the light emitting elements ED in each sub-pixel SPXn may include semiconductor layers made of the same material to emit light of the same color.

The light emitting elements ED may be in contact with the connection electrodes CNE: CNE1 and CNE2 to be electrically connected to the electrodes RME and the conductive layers below the via layer VIA, and may receive electrical signals applied thereto to emit light of a set or specific wavelength band.

A second insulating layer PAS2 may be on the plurality of light emitting elements ED, the first insulating layer PAS1, and the bank layer BNL. The second insulating layer PAS2 includes a pattern part extending in the first direction DR1 between the walls BP1 and BP2 and on the plurality of light emitting elements ED. The pattern part may partially surround outer surfaces of the light emitting elements ED, and may not cover both sides or both ends of the light emitting elements ED. The pattern part may form a linear or island-shaped pattern in each sub-pixel SPXn in a plan view. The pattern part of the second insulating layer PAS2 may fix the light emitting elements ED in the processes of fabricating the display device 10 while protecting the light emitting elements ED. In addition, the second insulating layer PAS2 may fill spaces between the light emitting elements ED and the first insulating layer PAS1 below the light emitting elements ED. In addition, portions of the second insulating layer PAS2 may be on the bank layer BNL and in the sub-areas SA.

The plurality of connection electrodes CNE: CNE1 and CNE2 may be on the plurality of electrodes RME and the walls BP1 and BP2. The first connection electrode CNE1 may be on the first electrode RME1 and the first wall BP1. The first connection electrode CNE1 may partially overlap the first electrode RME1, and may be provided from the emission area EMA to the sub-area SA beyond the bank layer BNL. The second connection electrode CNE2 may be on the second electrode RME2 and the second wall BP2. The second connection electrode CNE2 may partially overlap the second electrode RME2, and may be provided from the emission area EMA to the sub-area SA beyond the bank layer BNL.

The first connection electrode CNE1 and the second connection electrode CNE2 may be in contact with the light emitting elements ED, respectively. The first connection electrode CNE1 may partially overlap the first electrode RME1, and may be in contact with one ends of the light emitting elements ED. The second connection electrode CNE2 may partially overlap the second electrode RME2, and may be in contact with the other ends of the light emitting elements ED. The plurality of connection electrodes CNE are provided across the emission area EMA and the sub-area SA. The connection electrodes CNE may be in contact with the light emitting elements ED at portions thereof in the emission area EMA, and may be electrically connected to the third conductive layer at portions thereof in the sub-area SA. The first connection electrode CNE1 may be in contact with first ends of the light emitting elements ED, and the second connection electrode CNE2 may be in contact with second ends of the light emitting elements ED.

In the display device 10, the respective connection electrodes CNE may be in contact with the electrodes RME through the contact parts CT1 and CT2 in the sub-area SA The first connection electrode CNE1 may be in contact with the first electrode RME1 through the first contact part CT1 penetrating through the first insulating layer PAS1, the second insulating layer PAS2, and a third insulating layer PAS3 in the sub-area SA. The second connection electrode CNE2 may be in contact with the second electrode RME2 through the second contact part CT2 penetrating through the first insulating layer PAS1 and the second insulating layer PAS2 in the sub-area SA. The respective connection electrodes CNE may be electrically connected to the third conductive layer through the respective electrodes RME. The first connection electrode CNE1 may be electrically connected to the first transistor T1 to receive the first source voltage applied thereto, and the second connection electrode CNE2 may be electrically connected to the second voltage line VL2 to receive the second source voltage applied thereto. The respective connection electrodes CNE may be in contact with the light emitting elements ED in the emission area EMA to transfer the source voltages to the light emitting elements ED.

However, the disclosure is not limited thereto. In some embodiments, the plurality of connection electrodes CNE may be in direct contact with the third conductive layer or may be electrically connected to the third conductive layer through other patterns rather than the electrodes RME.

The connection electrodes CNE may include a conductive material. For example, the contact electrodes CNE may include ITO, IZO, ITZO, aluminum (Al), and/or the like. As an example, the connection electrodes CNE may include a transparent conductive material (e.g., a transparent electrically conductive material), and the light emitted from the light emitting elements ED may be transmitted through the connection electrodes CNE and then emitted.

The third insulating layer PAS3 is on the second connection electrode CNE2 and the second insulating layer PAS2. The third insulating layer PAS3 may be entirely on the second insulating layer PAS2 so as to cover the second connection electrode CNE2, and the first connection electrode CNE1 may be on the third insulating layer PAS3. The third insulating layer PAS3 may be entirely on the via layer VIA except for an area in which the first connection electrode CNE1 is provided. The third insulating layer PAS3 may insulate the first connection electrode CNE1 and the second connection electrode CNE2 from each other so that the first connection electrode CNE1 is not in direct contact with the second connection electrode CNE2.

In one or more embodiments, another insulating layer may be further on the third insulating layer PAS3 and the first connection electrode CNE1. Such an insulating layer may serve to protect members on the first substrate SUB from an external environment.

Each of the first insulating layer PAS1, the second insulating layer PAS2, and the third insulating layer PAS3 described above may include an inorganic insulating material (e.g., an inorganic electrically insulating material) and/or an organic insulating material (e.g., an organic electrically insulating material). As an example, each of the first insulating layer PAS1, the second insulating layer PAS2, and the third insulating layer PAS3 may include an inorganic insulating material (e.g., an inorganic electrically insulating material), or the first insulating layer PAS1 and the third insulating layer PAS3 may include an inorganic insulating material (e.g., an inorganic electrically insulating material), but the second insulating layer PAS2 may include an organic insulating material (e.g., an organic electrically insulating material). Each or at least one selected from the first insulating layer PAS1, the second insulating layer PAS2, and the third insulating layer PAS3 may be formed in a structure in which a plurality of insulating layers are alternately or repeatedly stacked. In an embodiment, each of the first insulating layer PAS1, the second insulating layer PAS2, and the third insulating layer PAS3 may be made of any one selected from silicon oxide ($SiO_x$), silicon nitride ($SiN_x$), and silicon oxynitride ($SiO_xN_y$). All of the first insulating layer PAS1, the second insulating layer PAS2, and the third insulating layer PAS3 may be made of the same material, some of the first insulating layer PAS1, the second insulating layer PAS2, and the third insulating layer PAS3 may be made of the same material and the others thereof may be made of a different material, or all of the first insulating layer PAS1, the second insulating layer PAS2, and the third insulating layer PAS3 may be made of different materials.

Figure 5:
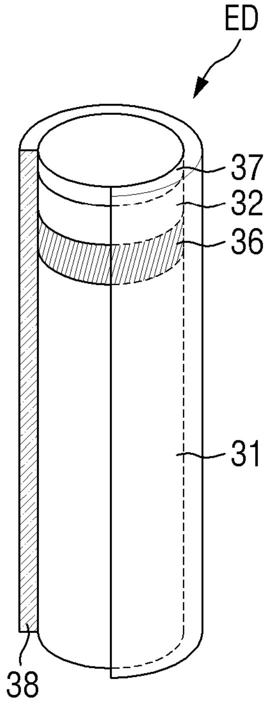
FIG. 5 is a schematic view of a light emitting element according to an embodiment.

FIG. 5 is a schematic view of a light emitting element according to an embodiment.

Referring to FIG. 5, the light emitting element ED may be a light emitting diode. In one or more embodiments, the light emitting element ED may be an inorganic light emitting diode having a size of a nanometer to micrometer scale and made of an inorganic material. The light emitting elements ED may be aligned between two electrodes in which polarities are formed when an electric field is formed in a set or specific direction between the two electrodes facing each other.

The light emitting element ED according to an embodiment may have a shape in which it extends in one direction. The light emitting element ED may have a shape such as a cylindrical shape, a rod shape, a wire shape, or a tube shape. However, the light emitting element ED is not limited to having the shape described above, and may have various suitable shapes. For example, the light emitting element ED may have a polygonal prismatic shape such as a cubic shape, a rectangular parallelepiped shape, or a hexagonal prismatic shape or have a shape in which it extends in one direction and has partially inclined outer surfaces.

The light emitting element ED may include a semiconductor layer doped with any conductivity-type (e.g., p-type or n-type) dopant. The semiconductor layer may receive an electrical signal applied from an external power source to emit light of a set or specific wavelength band. The light emitting element ED may include a first semiconductor layer 31, a second semiconductor layer 32, a light emitting layer 36, an electrode layer 37, and an insulating film 38 (e.g., an electrically insulating film 38).

The first semiconductor layer 31 may be an n-type semiconductor. The first semiconductor layer 31 may include a semiconductor material having a formula of $Al_xGa_yIn_{1-x-y}N$ ($0 \le x \le 1$, $0 \le y \le 1$, and $0 \le x+y \le 1$). For example, the semiconductor material of the first semiconductor layer 31 may be one or more of AlGaInN, GaN, AlGaN, InGaN, AlN, and/or InN doped with an n-type dopant. The n-type dopant doped in the first semiconductor layer 31 may be Si, Ge, Sn, Se, and/or the like.

The second semiconductor layer 32 is on the first semiconductor layer 31 with the light emitting layer 36 interposed therebetween. The second semiconductor layer 32 may be a p-type semiconductor, and may include a semiconductor material having a formula of $Al_xGa_yn_{1-x-y}N$ ($0 \le x \le 1$, $0 \le y \le 1$, and $0 \le x+y \le 1$). For example, the semiconductor material of the second semiconductor layer 32 may be one or more of AlGaInN, GaN, AlGaN, InGaN, AlN, and/or InN doped with a p-type dopant. The p-type dopant doped in the second semiconductor layer 32 may be Mg, Zn, Ca, Ba, and/or the like.

It has been illustrated in FIG. 5 that each of the first semiconductor layer 31 and the second semiconductor layer 32 is configured as one layer, but the disclosure is not limited thereto. Each of the first semiconductor layer 31 and the second semiconductor layer 32 may further include a larger number of layers, for example, a clad layer and/or a tensile strain barrier reducing (TSBR) layer, depending on a material of the light emitting layer 36. For example, the light emitting element ED may further include other semiconductor layers between the first semiconductor layer 31 and the light emitting layer 36 and/or between the second semiconductor layer 32 and the light emitting layer 36. The semiconductor layer between the first semiconductor layer 31 and the light emitting layer 36 may be made of one or more of AlGaInN, GaN, AlGaN, InGaN, AlN, and/or InN doped with an n-type dopant, and the semiconductor layer between the second semiconductor layer 32 and the light emitting layer 36 may be made of one or more of AlGaInN, GaN, AlGaN, InGaN, AlN, and/or InN doped with a p-type dopant.

The light emitting layer 36 may be between the first semiconductor layer 31 and the second semiconductor layer 32. The light emitting layer 36 may include a material having a single or multiple quantum well structure. When the light emitting layer 36 includes the material having the multiple quantum well structure, the light emitting layer 36 may have a structure in which a plurality of quantum layers and well layers are alternately stacked. The light emitting layer 36 may emit light by a combination of electron-hole pairs according to electrical signals applied through the first semiconductor layer 31 and the second semiconductor layer 32. The light emitting layer 36 may include a material such as AlGaN, AlGaInN, and/or InGaN. In one or more embodiments, when the light emitting layer 36 has the multiple quantum well structure, that is, the structure in which the quantum layers and the well layers are alternately stacked, the quantum layers may include a material such as AlGaN and/or AlGaInN, and the well layers may include a material such as GaN and/or AlInN.

The light emitting layer 36 may have a structure in which semiconductor materials having large band gap energy and semiconductor materials having small band gap energy are alternately stacked, and may include other Group III to Group V semiconductor materials depending on a wavelength band of emitted light. The light emitted by the light emitting layer 36 is not limited to light of a blue wavelength band, and in some cases, the light emitting layer 36 may also emit light of red and/or green wavelength bands.

The electrode layer 37 may be an ohmic connection electrode. However, the disclosure is not limited thereto, and the electrode layer 37 may also be a Schottky connection electrode. The light emitting element ED may include at least one electrode layer 37. The light emitting element ED may include one or more electrode layers 37, but the disclosure is not limited thereto, and the electrode layers 37 may also be omitted.

The electrode layer 37 may decrease resistance between the light emitting element ED and an electrode or a connection electrode when the light emitting element ED is electrically connected to the electrode or the connection electrode in the display device 10. The electrode layer 37 may include a metal having conductivity (e.g., electrical conductivity). The electrode layer 37 may include at least one selected from aluminum (Al), titanium (Ti), indium (In), gold (Au), silver (Ag), ITO, IZO, and ITZO.

The insulating film 38 surrounds outer surfaces of the plurality of semiconductor layers and the electrode layer described above. For example, the insulating film 38 may surround at least an outer surface of the light emitting layer 36, but may expose both ends of the light emitting element ED in a length direction. In addition, the insulating film 38 may also be formed so that an upper surface thereof is rounded in cross section in an area adjacent to at least one end of the light emitting element ED.

The insulating film 38 may include at least one selected from materials having insulating properties, such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). It has been illustrated in FIG. 5 that the insulating film 38 is formed as a single layer, but the disclosure is not limited thereto, and in some embodiments, the insulating film 38 may also be formed in a multilayer structure in which a plurality of layers are stacked.

The insulating film 38 may serve to protect the semiconductor layers and the electrode layer of the light emitting element ED. The insulating film 38 may prevent (or reduce a likelihood or occurrence of) an electrical short-circuit that may occur in the light emitting layer 36 when the light emitting layer 36 is in direct contact with an electrode through which an electrical signal is transferred to the light emitting element ED. In addition, the insulating film 38 may prevent or reduce a decrease in luminous efficiency of the light emitting element ED.

In addition, an outer surface of the insulating film 38 may be surface-treated. The light emitting elements ED may be jetted onto and be aligned on electrodes in a state in which they are dispersed in a set or predetermined ink (e.g., a set or predetermined ink composition). Here, in order to maintain (or substantially maintain) the light emitting elements ED in a state in which the light emitting elements ED are dispersed without being agglomerated with other adjacent light emitting elements ED in the ink, a hydrophobic or hydrophilic treatment may be performed on a surface of the insulating film 38.

Figure 6:
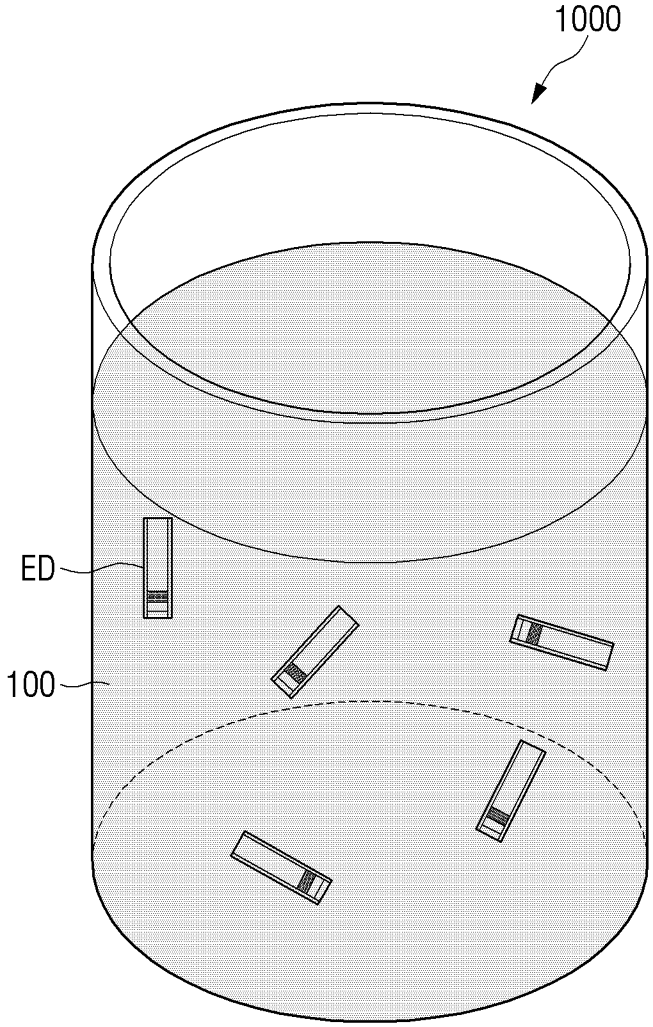
FIG. 6 is a schematic view of a light emitting element ink according to an embodiment.

FIG. 6 is a schematic view of a light emitting element ink according to an embodiment.

Referring to FIG. 6, a light emitting element ink 1000 according to an embodiment includes a light emitting element solvent 100 and light emitting elements ED dispersed in the light emitting element solvent 100. A description of the light emitting element ED is the same as that described above, and thus, the light emitting element solvent 100 will hereinafter be described in more detail.

The light emitting element solvent 100 may store the light emitting elements ED in a state in which the light emitting elements ED are dispersed therein, and may be an organic solvent that does not react with the light emitting elements ED. In addition, the light emitting element solvent 100 may have a viscosity enough to be discharged through a nozzle of an inkjet printing device. Solvent molecules may disperse the light emitting elements ED while surrounding the light emitting elements ED on surfaces of the light emitting elements ED.

The term 'light emitting element solvent 100' as used herein may refer to a solvent and/or a medium in which the light emitting elements ED may be dispersed, and the term 'solvent molecule' as used herein may refer to one molecule constituting the light emitting element solvent 100. As further described herein below, the 'light emitting element solvent 100' may be a liquid medium formed by the 'solvent molecules' and solvent molecules in an ion state formed through dissociation of some of the 'solvent molecules'. However, these terms are not necessarily used separately, and in some cases, the terms 'light emitting element solvent 100' and 'solvent molecule' may be used interchangeably and may refer to the same or substantially the same thing.

Some of the solvent molecules of the light emitting element solvent 100 may be in a charged ion state because some of the intramolecular bonds are separated and are dissociated in the solvent, and may form a single micelle structure while surrounding surfaces of the light emitting elements ED. The charged solvent molecular ions may form a double layer between the surfaces of the light emitting elements ED and a bulk fluid (BF) of the light emitting element solvent 100.

The light emitting element ink 1000 may include the light emitting element solvent 100 and the light emitting elements ED dispersed in the light emitting element solvent 100, and may be used in the inkjet printing process of jetting the light emitting elements ED onto a substrate on which the electrodes RME1 and RME2 are formed in the processes of fabricating the display device 10 described above. The light emitting element solvent 100 may maintain (or substantially maintain) the light emitting elements ED in the state in which the light emitting elements ED are dispersed, and may have physical properties suitable for the light emitting elements ED to be smoothly aligned on the electrodes RME1 and RME2 when it is jetted onto the substrate on which the electrodes RME1 and RME2 are formed. For example, the light emitting element solvent 100 may have a viscosity suitable for being discharged from the inkjet printing device while maintaining (or substantially maintaining) the light emitting elements ED in the state in which the light emitting elements ED are dispersed, and may have an electrical conductivity and a dielectric constant suitable for the light emitting elements ED to be aligned by an electric field when the electric field is generated on (or at) the electrodes RME1 and RME2.

When the light emitting element ink 1000 is jetted onto the substrate, physical properties of the light emitting element ink 1000 may be changed by impurities remaining on the substrate and/or materials eluted from the insulating layer on the substrate. For example, in the display device 10, a surface of the bank layer BNL may be fluorine (F)-treated so that the light emitting element ink 1000 may be seated (e.g., deposited) in the emission area EMA, but when the light emitting element ink 1000 is jetted, fluorine ions ($F^-$) may be eluted from the surface of the bank layer BNL into the light emitting element solvent 100. Materials such as impurities and/or fluorine ions ($F^-$) eluted from the substrate onto which the light emitting element ink 1000 is jetted may change the physical properties of the light emitting element solvent 100, and may allow the light emitting elements ED not to be aligned on the electrodes RME1 and RME2. It is possible to remove impurities remaining on the substrate before the inkjet printing process, but it may be difficult to physically remove impurities such as ions eluted from the insulating layer on the substrate.

According to an embodiment, the light emitting element solvent 100 of the light emitting element ink 1000 may include a solvent molecule and an ion remover capable of removing impurity ions that would change physical properties of the light emitting element solvent 100 in the inkjet printing process. In an embodiment, the light emitting element solvent 100 may include a compound represented by Formula 1 and an ion remover represented by Formula 2.

$R^1—(OH)_n$ Formula 1

$R^1—(O—SiR^2_3)_n$ Formula 2

In Formulas 1 and 2, $R^1$ is any one selected from Formulas 3 to 5, $R^2$ is any one selected from hydrogen (H), a $C_1$-$C_{15}$ alkyl group, a $C_2$-$C_{15}$ alkylene group, a $C_2$-$C_{15}$ alkenyl group, a $C_2$-$C_{15}$ alkynyl group, a $C_1$-$C_{15}$ alkyl ether group, a $C_2$-$C_{15}$ alkenyl ether group, and

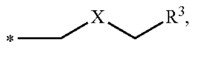

and n is an integer of 1 or 2. Here, X is a heteroatom such as oxygen (O), nitrogen (N), sulfur (S), and phosphorus (P), $R^3$ is at least one selected from a $C_3$-$C_{13}$ alkyl group, a $C_4$-$C_{13}$ alkylene group, a $C_4$-$C_{13}$ alkenyl group, a $C_4$-$C_{13}$ alkynyl group, a $C_3$-$C_{13}$ alkyl ether group, and a $C_4$-$C_{13}$ alkenyl ether group.

Formula 3

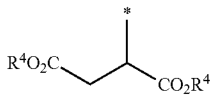

Formula 4

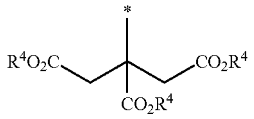

Formula 5

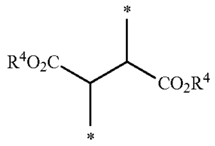

In Formulas 3 to 5, $R^4$ is at least one selected from a $C_1$-$C_{15}$ alkyl group, a $C_2$-$C_{15}$ alkylene group, a $C_2$-$C_{15}$ alkenyl group, a $C_2$-$C_{15}$ alkynyl group, a $C_1$-$C_{15}$ alkyl ether group, and a $C_2$-$C_{15}$ alkenyl ether group, and '*' in Formulas 1 to 5 is a bonding site. In Formulas 1 and 2, n may change depending on a type of $R^1$. For example, in Formulas 1 and 2, when $R^1$ is any one selected from Formulas 3 and 4, n may be 1, and when $R^1$ is Formula 5, n may be 2.

Formulas 1 and 2 may include the same $R^1$—O—* functional group. In the light emitting element solvent 100, the solvent molecule represented by Formula 1 may be a secondary or tertiary alcohol ($R^1$—OH) compound. The light emitting element solvent 100 may be an organic solvent having a viscosity suitable for being discharged through a nozzle while being capable of dispersing the light emitting elements ED without (or substantially without) reacting with the light emitting elements ED by including the solvent molecule represented by Formula 1. The ion remover represented by Formula 2 may include a silyl group (*—$SiR^2_3$), which is a leaving group that is bound to a secondary or tertiary ether group and may react with impurity ions.

In an embodiment, the light emitting element solvent 100 may include a solvent molecule represented by any one selected from Formulas A1 to C1 (Formula A1, B1, or C1) and an ion remover represented by any one selected from Formulas A2 to C2 (Formula A2, B2, or C2).

Formula A1

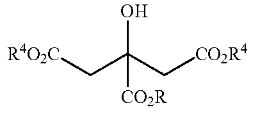

Formula B1

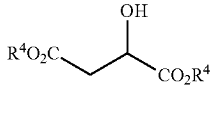

Formula C1

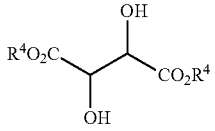

-continued

Formula A2

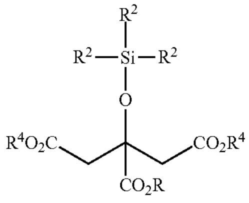

Formula B2

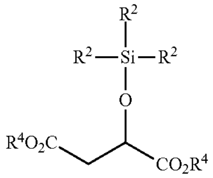

Formula C2

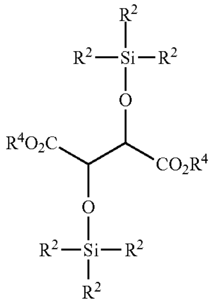

In Formulas A1 to C1 and A2 to C2, $R^2$ and $R^4$ are the same as those described above.

The light emitting element solvent 100 may include at least one selected from compounds represented by Formulas A1 to C1 as the solvent molecule and at least one selected from compounds represented by Formulas A2 to C2 as the ion remover. For example, the light emitting element solvent 100 may include any one selected from Formulas A1, B1, and C1 as the solvent molecule and any one selected from Formulas A2, B2, and C2 as the ion remover or may be a mixture including each of Formulas A1 to C1 and A2 to C2.

When the light emitting element ink 1000 is jetted onto the substrate and impurity ions are eluted into the light emitting element ink, the ion remover may react with the impurity ions. In the ion remover represented by Formula 2, the silyl group ($*—SiR^2_3$) may form a complex by reacting with the impurity ions and may be left from the ion remover, and the ion remover may include an alcohol group as in Formula 1 as a functional group. When the silyl group ($*—SiR^2_3$) is removed from the ion remover, the ion remover may become a compound that is substantially the same as the solvent molecule of Formula 1. Physical properties of the light emitting element solvent 100 may be designed based on the solvent molecule represented by Formula 1, and the designed physical properties may be maintained (or substantially maintained) as they are (e.g., as they are designed) while removing only (or substantially only) the impurity ions by adding a trace amount of ion remover.

FIGS. 7-11 are schematic views illustrating a reaction between an ion remover of the light emitting element ink and impurity ions. FIGS. 7-11 schematically illustrate a process in which impurity ions eluted from a base substrate BS are removed by the ion remover of the light emitting element solvent 100 when the light emitting element solvent 100 is jetted onto the base substrate BS that is surface-treated.

Figure 7:
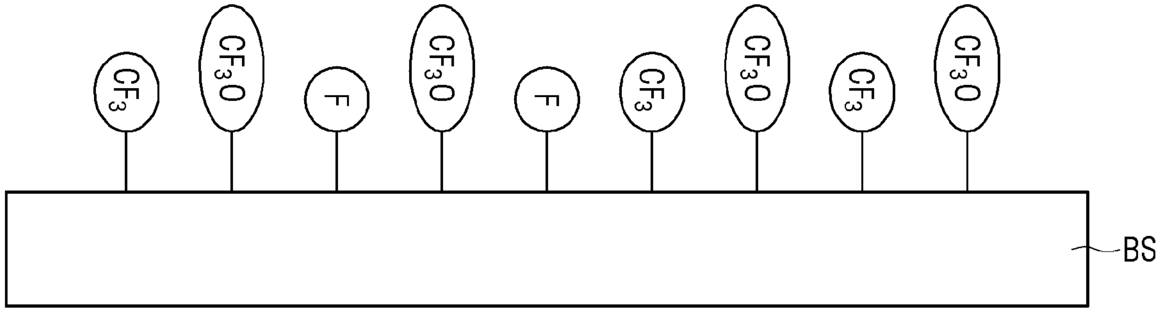
FIGS. 7-11 are schematic views illustrating a reaction between an ion remover of the light emitting element ink and impurity ions.

First, referring to FIG. 7, the base substrate BS of which a surface is fluorine-treated may be in a state in which a compound including fluorine (F) is bonded to the surface. The fluorine-treated surface may have a hydrophobic property, and the light emitting element solvent 100 on the base substrate BS may be seated (e.g., deposited) at a jetted position without (or substantially without) spreading. As further described herein below, a hydrophobic treatment may be performed on the surface of the bank layer BNL of the display device 10 in the processes of fabricating the display device 10 using the light emitting element ink 1000, and when the light emitting element ink 1000 is jetted onto the emission area EMA surrounded by the bank layer BNL, the bank layer BNL may prevent or reduce the light emitting element ink 1000 from overflowing from the emission area EMA.

Functional groups including fluorine (F) may be formed on the surface of the base substrate BS that is fluorine-treated. For example, various suitable functional groups including fluorine (F), such as $—CF_3$, $—CF_3O$, and/or —F may be formed on the surface of the base substrate BS. The above-described functional groups may have hydrophobic properties, and when a hydrophilic solvent is jetted onto the base substrate BS, the hydrophilic solvent may be seated (e.g., deposited) in a round shape without (or substantially without) spreading.

Figure 8:
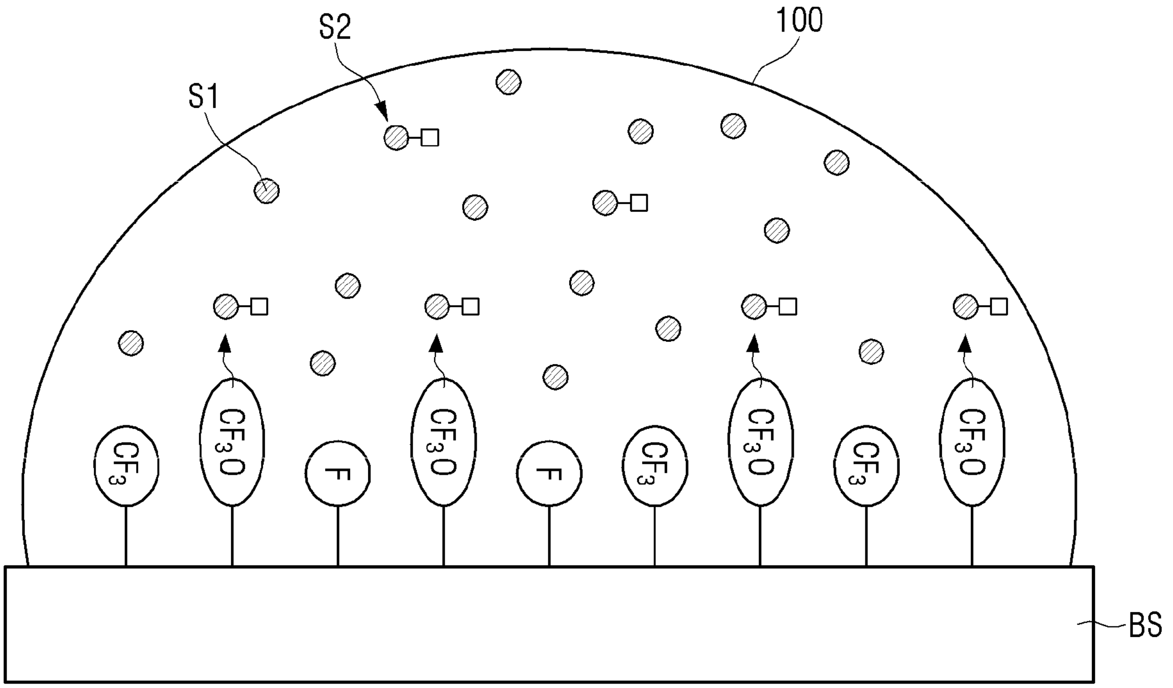
Figure 9:
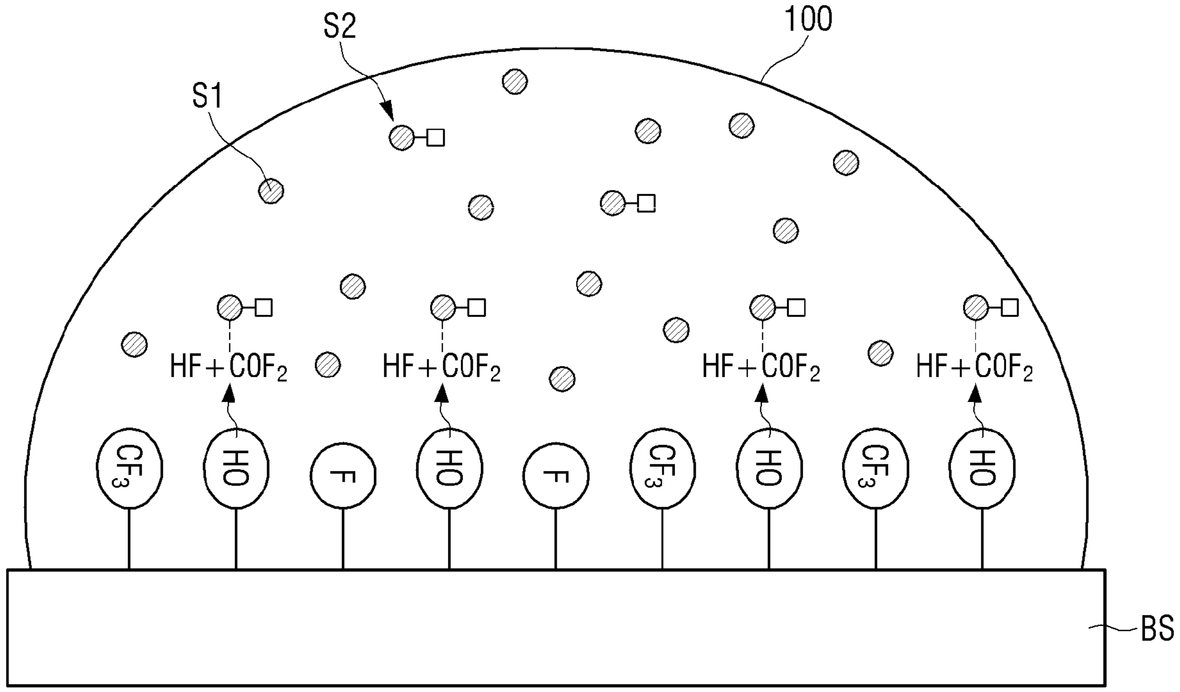

Next, referring to FIGS. 8-9, when the light emitting element solvent 100 according to an embodiment is jetted onto the surface-treated base substrate BS (FIG. 8), hydrogen fluoride (HF) and $COF_2$ including fluorine ions ($F^-$), which are impurity ions, may be eluted from a $—CF_3O$ functional group formed on the surface of the base substrate BS (FIG. 9). The light emitting element solvent 100 may include a solvent molecule S1 represented by Formula 1 and an ion remover S2 represented by Formula 2. When hydrogen fluoride (HF) is dissociated into ions, it becomes fluorine ions ($F^-$), which may change an electrical conductivity of the light emitting element solvent 100. A —OH group may remain on the surface of the base substrate BS.

Figure 10:
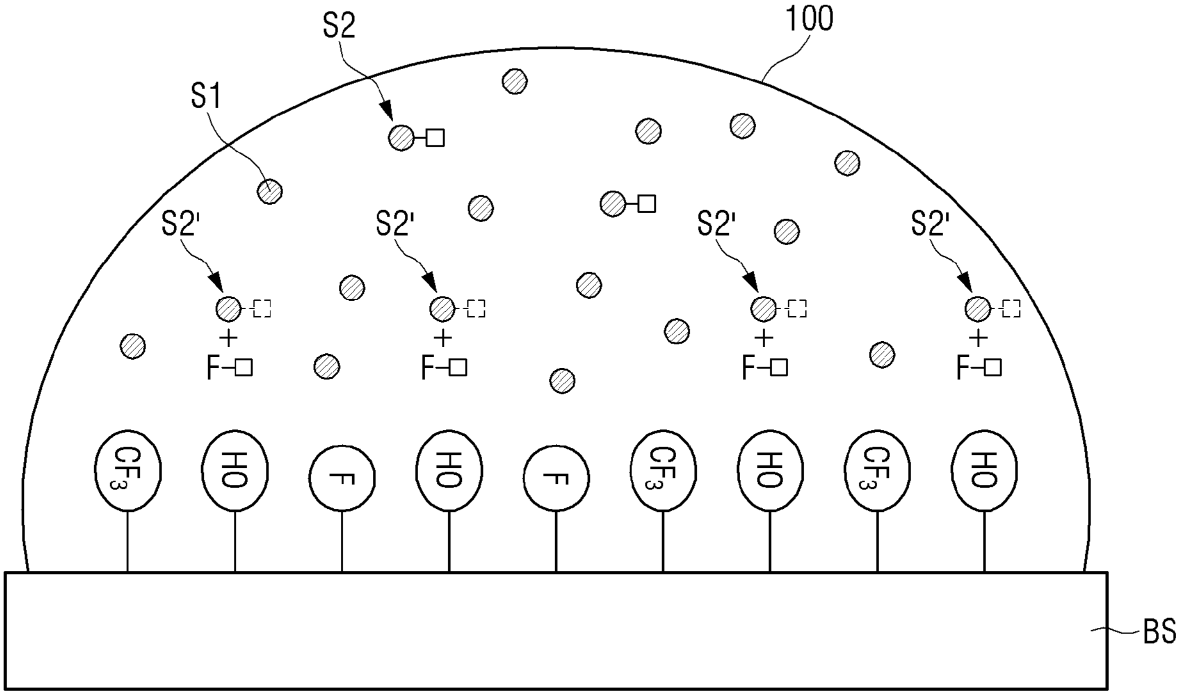

Referring to FIG. 10, the ion remover S2 of the light emitting element solvent 100 may react with the fluorine ions ($F^-$) formed by dissociation of hydrogen fluoride (HF) into the ions to remove a silyl group, which is a leaving group, and the silyl group may form a complex with the fluorine ions. In the ion remover (S2), the silyl group may be a functional group that is easily left, and the left silyl group may remove anions in the light emitting element solvent 100 while forming a complex with the fluorine ions ($F^-$). In an ion remover S2' in which the silyl group is left, $R^1—O^-$ in Formula 2 may react with hydrogen ions ($H^+$) of hydrogen fluoride to form alcohol ($R^1—OH$), which is substantially the same compound as the solvent molecule S1. As illustrated in FIG. 10, within the light emitting element solvent 100, all of the fluorine ions ($F^-$) eluted from the base substrate BS may be removed and the solvent molecule S1 of the light emitting element solvent 100, the ion remover S2' in which the silyl group is removed, and an unreacted ion remover S2 may remain. Because the ion remover S2' in which the silyl group is removed may be substantially the same compound as the solvent molecule S1, even though the impurity ions are eluted from the base substrate BS into the light emitting element solvent 100 including the solvent molecule S1 and the ion remover S2, a viscosity, a dielectric constant, and an electrical conductivity, which are physical properties of the light emitting element solvent 100 set at the time of designing the light emitting element solvent 100, may be maintained (or substantially maintained) as they are.

Accordingly, processes after the light emitting element ink 1000 including the light emitting element solvent 100 and the light emitting elements ED is jetted onto the base substrate BS of which the surface is fluorine-treated may be performed without a change in process conditions considered at the time of designing the light emitting element solvent 100 regardless of surface characteristics of the base substrate BS.

The light emitting element solvent 100 may include the ion remover, but may include the ion remover in a relatively small amount so as to remove only the impurity ions, for example, the fluorine ions ($F^-$), eluted from the ink in the inkjet printing process. According to an embodiment, the light emitting element solvent 100 may include 1 wt % or less of the ion remover with respect to 100 wt % of the light emitting element solvent. The light emitting element solvent 100 may have physical properties designed based on the solvent molecule represented by Formula 1, and may include the ion remover in an amount that does not significantly affect the designed physical properties.

Figure 11:
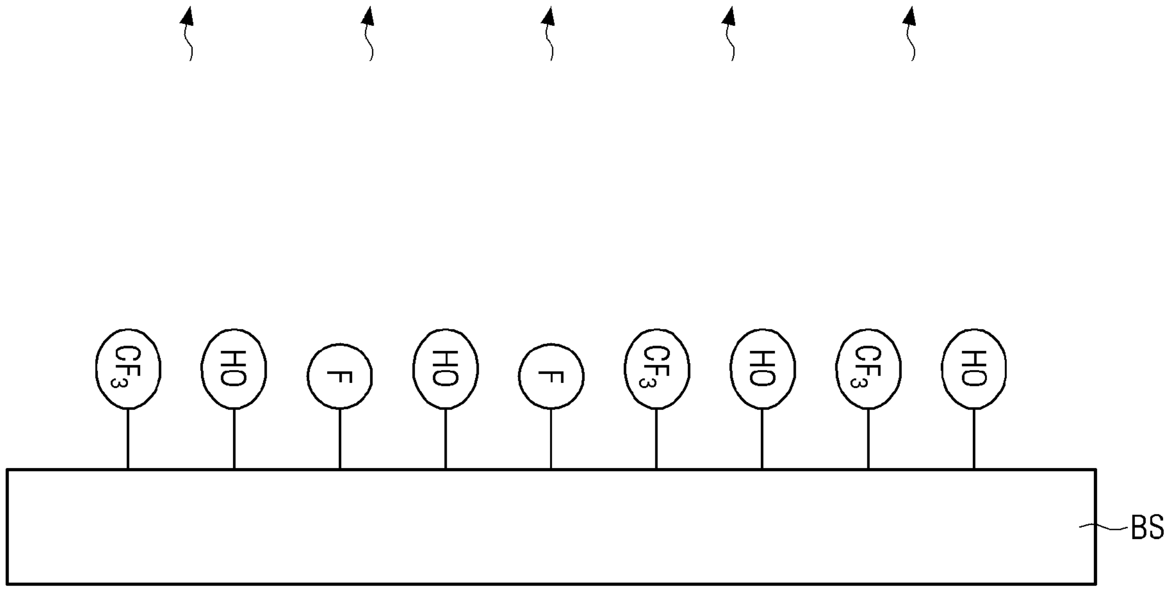

Next, referring to FIG. 11, the light emitting element solvent 100 is removed on (or from) the base substrate BS by removing the solvent molecule S1, the ion remover S2, and the ion remover S2' in which the silyl group is removed. When the inkjet printing process is performed on the base substrate BS using the light emitting element ink 1000 including the light emitting elements ED, only (or substantially only) the light emitting elements ED may remain on the base substrate BS and the light emitting element solvent 100 may be smoothly removed. When the light emitting element solvent 100 according to an embodiment is used, it is possible to provide the light emitting elements ED on the base substrate BS through the inkjet printing process. As an example, in a process of aligning the light emitting elements ED at set or specific positions by generating an electric field on (or at) the base substrate BS, the light emitting element solvent 100 may not (or substantially may not) have a change in physical properties even though the base substrate BS is surface-treated, and the light emitting elements ED may be provided at suitable or desired positions through an electrical process.

Figure 12:
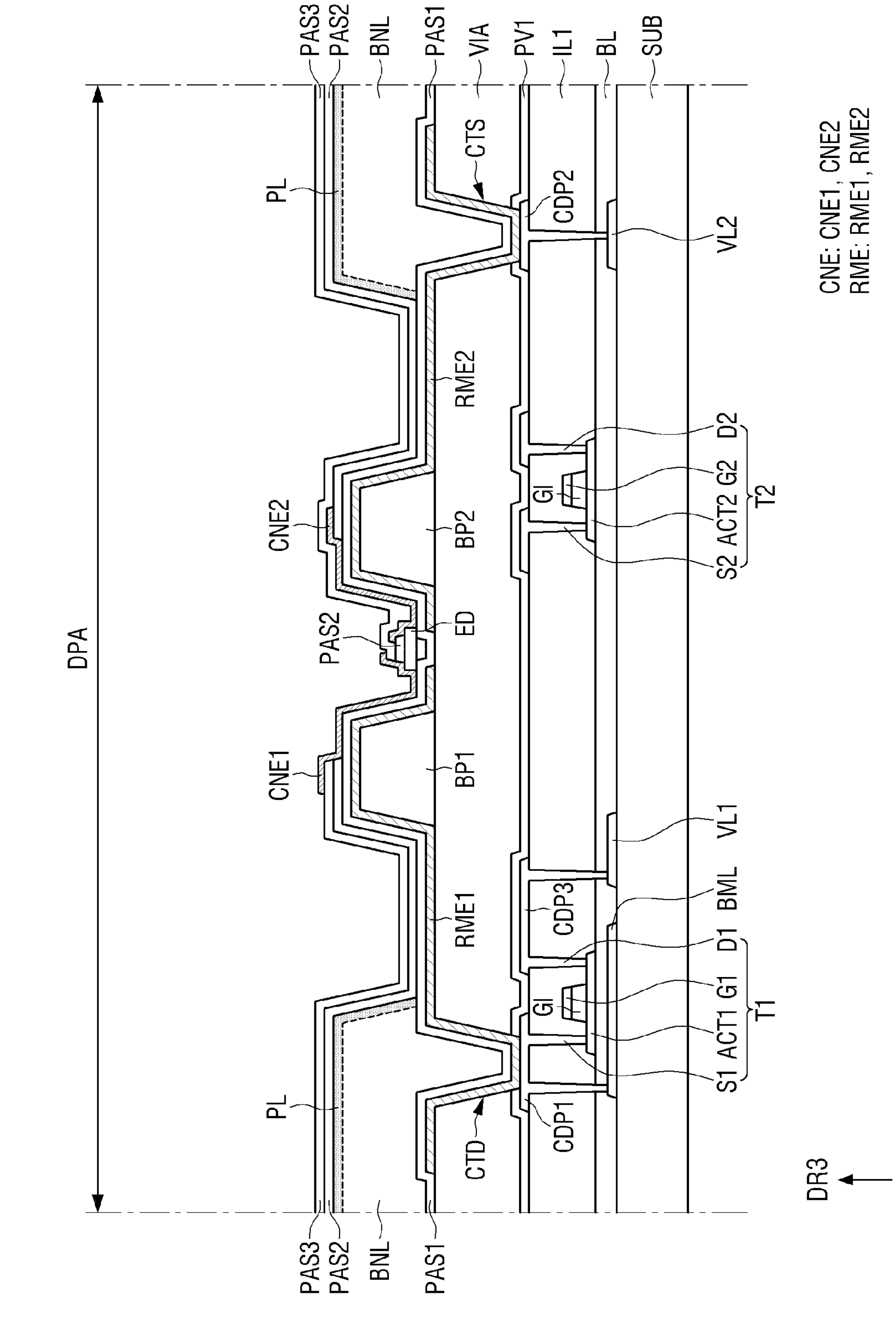
FIG. 12 is a cross-sectional view illustrating a portion of the display device according to an embodiment.

FIG. 12 is a cross-sectional view illustrating a portion of the display device according to an embodiment.

Referring to FIG. 12, in the display device 10, a hydrophobic treatment is performed on the surface of the bank layer BNL, such that a hydrophobic layer PL may be on the surface of the bank layer BNL. In the processes of fabricating the display device 10, the light emitting element ink 1000 including the light emitting elements ED and the light emitting element solvent 100 may be jetted onto an area surrounded by the bank layer BNL or the emission area EMA. The bank layer BNL includes the surface subjected to the hydrophobic treatment or the hydrophobic layer PL, and accordingly, the light emitting element ink 1000 may be seated (e.g., deposited) in the emission area EMA without overflowing from the bank layer BNL. The light emitting elements ED may be on the electrodes RME1 and RME2 by the electric field generated on (or at) the electrodes RME1 and RME2 within the area surrounded by the bank layer BNL.

In one or more embodiments, the light emitting element solvent 100 may include a 1,3-dicarbonyl group in addition to the solvent molecule of Formula 1 and the ion remover of Formula 2, and may further include a compound represented by any one selected from Formulas D to F.

Formula D

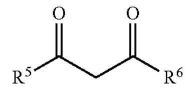

Formula E

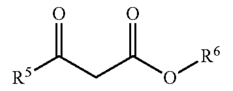

Formula F

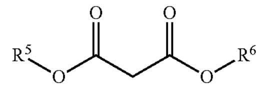

In Formulas D to F, $R^5$ and $R^6$ may be each independently any one selected from a $C_1$-$C_{10}$ alkyl group, a $C_2$-$C_{10}$ alkenyl group, a $C_2$-$C_{10}$ alkynyl group, a $C_1$-$C_{10}$ alkyl ether group, and a $C_2$-$C_{10}$ alkenyl ether group.

The solvent molecule of the light emitting element solvent 100 may include the 1,3-dicarbonyl group, such that carbon ($—CH_2$) positioned between two carbonyl groups ($—C{=}O$) may be stabilized by an adjacent carbonyl group ($—C{=}O$) when hydrogen is separated from carbon ($—CH_2$) to form a negative charge. The light emitting element solvent 100 may further include the compound represented by Formulas D to F to have set or specific physical properties to be further described herein below and smoothly disperse the light emitting elements ED in the light emitting element solvent.

According to an embodiment, the light emitting element solvent 100 of the light emitting element ink 1000 may have a set or specific viscosity value, and the light emitting elements ED may be discharged from a nozzle through an inkjet printing process in a state in which they are dispersed in the light emitting element solvent 100. Even though the light emitting elements ED include a material having a high specific gravity, a printing process may be performed before the light emitting elements ED are precipitated in the light emitting element solvent 100 having fluidity, and the number of light emitting elements ED per unit droplet of the light emitting element ink 1000 discharged from the nozzle of the inkjet printing device may be uniformly (or substantially uniformly) maintained (or substantially maintained).

In one or more embodiments, 'printing' of the light emitting elements ED as used herein may mean discharging and/or jetting the light emitting elements ED to a set or predetermined target using the inkjet printing device. For example, printing the light emitting elements ED may mean discharging the light emitting elements ED directly through the nozzle of the inkjet printing device and/or discharging the light emitting elements ED in a state in which the light emitting elements ED are dispersed in the light emitting element ink 1000. However, the disclosure is not limited thereto, and printing the light emitting elements ED may mean jetting the light emitting elements ED or the light emitting element ink 1000 in which the light emitting elements ED are dispersed onto a target substrate and seating (e.g., depositing) the light emitting elements ED or the light emitting element ink 1000 on the target substrate.

The light emitting element solvent 100 may have a viscosity enough to be discharged through the nozzle of the inkjet printing device. In an embodiment, a viscosity of the light emitting element solvent 100 measured at room temperature of 25° C. may be in the range of 15 cP to 25 cP, 18 cP to 22 cP, or about 20 cP. The light emitting element solvent 100 having the viscosity within the above range may be smoothly discharged through the nozzle, and even though the light emitting elements ED are slowly precipitated in the light emitting element solvent 100, the printing process may be performed before the light emitting elements ED are precipitated in the light emitting element solvent 100, and thus, a dispersion degree of the light emitting elements ED may be maintained (or substantially maintained).

The light emitting element solvent 100 may have a set or specific dielectric constant and electrical conductivity values. The light emitting elements ED dispersed in the light emitting element solvent 100 may receive a dielectrophoretic force by reacting with an electric field when they are put in the electric field, and the dielectrophoretic force that the light emitting elements ED receive by the electric field may increase according to a dielectric constant and an electrical conductivity of the light emitting element solvent 100. The light emitting element solvent 100 according to an embodiment may have a dielectric constant of 6.0 to 7.0, 6.3 to 6.6, or about 6.5. In addition, the light emitting element solvent 100 may have an electrical conductivity in the range of 0 to 0.4 μs/m. The light emitting element solvent 100 may include the solvent molecule represented by Formula 1 and the ion remover represented by Formula 2 and may have the viscosity, the dielectric constant, and the electrical conductivity within the above-described ranges, the light emitting element ink 1000 may be jetted onto the substrate in a state in which the light emitting elements ED are dispersed therein in the inkjet printing process, and the light emitting elements ED may be smoothly aligned on the electrodes. The light emitting elements ED may be in a set or specific area while their positions and orientation directions are changed by the dielectrophoretic force, and as the light emitting element solvent 100 has the above-described physical properties and dielectrophoretic reactivity of the light emitting elements ED increases, deviations in alignment directions and positions of the respective light emitting elements ED may be decreased. In one or more embodiments, an alignment degree of the light emitting elements ED may be improved.

The 'alignment degree' of the light emitting elements ED may refer to deviations in orientation directions and seated (e.g., deposited) positions of the light emitting elements ED aligned on the substrate. For example, it may be understood that when the deviations in the orientation directions and the seated (e.g., deposited) positions of the light emitting elements ED are great, the alignment degree of the light emitting elements ED is low, and when the deviations in the orientation directions and the seated (e.g., deposited) positions of the light emitting elements ED are small, the alignment degree of the light emitting elements ED is high or improved.

In an embodiment, the light emitting elements ED may be printed in a unit area through the inkjet printing process, and the number of light emitting elements ED provided per unit area in a device fabricated using the inkjet printing process, for example, the display device 10 may be uniform (or substantially uniform). The light emitting element solvent 100 includes the ion remover, such that a change in physical properties of the light emitting element solvent 100 may be small when the light emitting element ink 1000 is jetted onto the substrate of the display device 10, and initially designed physical property values of the light emitting element solvent 100 may be maintained (or substantially maintained) as they are, and thus, the light emitting elements ED may be on the electrodes RME1 and RME2 of the display device 10 with a high alignment degree. The light emitting element ink 1000 according to an embodiment may improve product reliability of the display device 10 in fabricating the display device 10 including the light emitting elements ED.

Hereinafter, a method of fabricating the display device 10 according to an embodiment will be further described.

The method of fabricating the display device 10 according to an embodiment may include preparing a substrate on which the first electrode RME1 and the second electrode RME2 are formed and the bank layer BNL is formed and the light emitting element ink 1000 including the light emitting element solvent 100 and the light emitting elements ED, the bank layer BNL having the surface on which the hydrophobic treatment is performed and surrounding an area in which the electrodes RME1 and RME2 are provided; jetting the light emitting element ink 1000 onto the area surrounded by the bank layer BNL and jetting the light emitting element ink 1000 onto the electrodes RME1 and RME2; and generating the electric field on (or at) the electrodes RME1 and RME2 and seating (e.g., depositing) the light emitting elements ED on the electrodes RME1 and RME2.

The light emitting elements ED may be prepared in a state in which they are dispersed in the light emitting element ink 1000, and may be discharged onto the electrodes RME1 and RME2 through the inkjet printing process. When the light emitting element ink 1000 is discharged onto the electrodes RME1 and RME2, the electric field is generated on (or at) the target substrate or the electrodes RME1 and RME2 to seat (e.g., deposit) the light emitting elements ED on the electrodes RME1 and RME2. According to an embodiment, the light emitting element solvent 100 of the light emitting element ink 1000 may include the solvent molecule and the ion remover, and thus, a change in electrical conductivity of the light emitting element solvent 100 due to the impurity ions eluted from the surface of the bank layer BNL may be prevented or reduced even though the light emitting element solvent 100 is jetted onto the bank layer BNL having the surface on which the hydrophobic treatment is performed. Accordingly, the designed physical properties of the light emitting element solvent 100 may be maintained (or substantially maintained) as they are (e.g., as they are designed), and the light emitting elements ED may be seated (e.g., deposited) on the electrodes RME1 and RME2 by the electric field in the state in which they are dispersed in the light emitting element solvent 100.

FIGS. 13-18 are cross-sectional views illustrating some of processes of fabricating the display device according to an embodiment.

Figure 13:
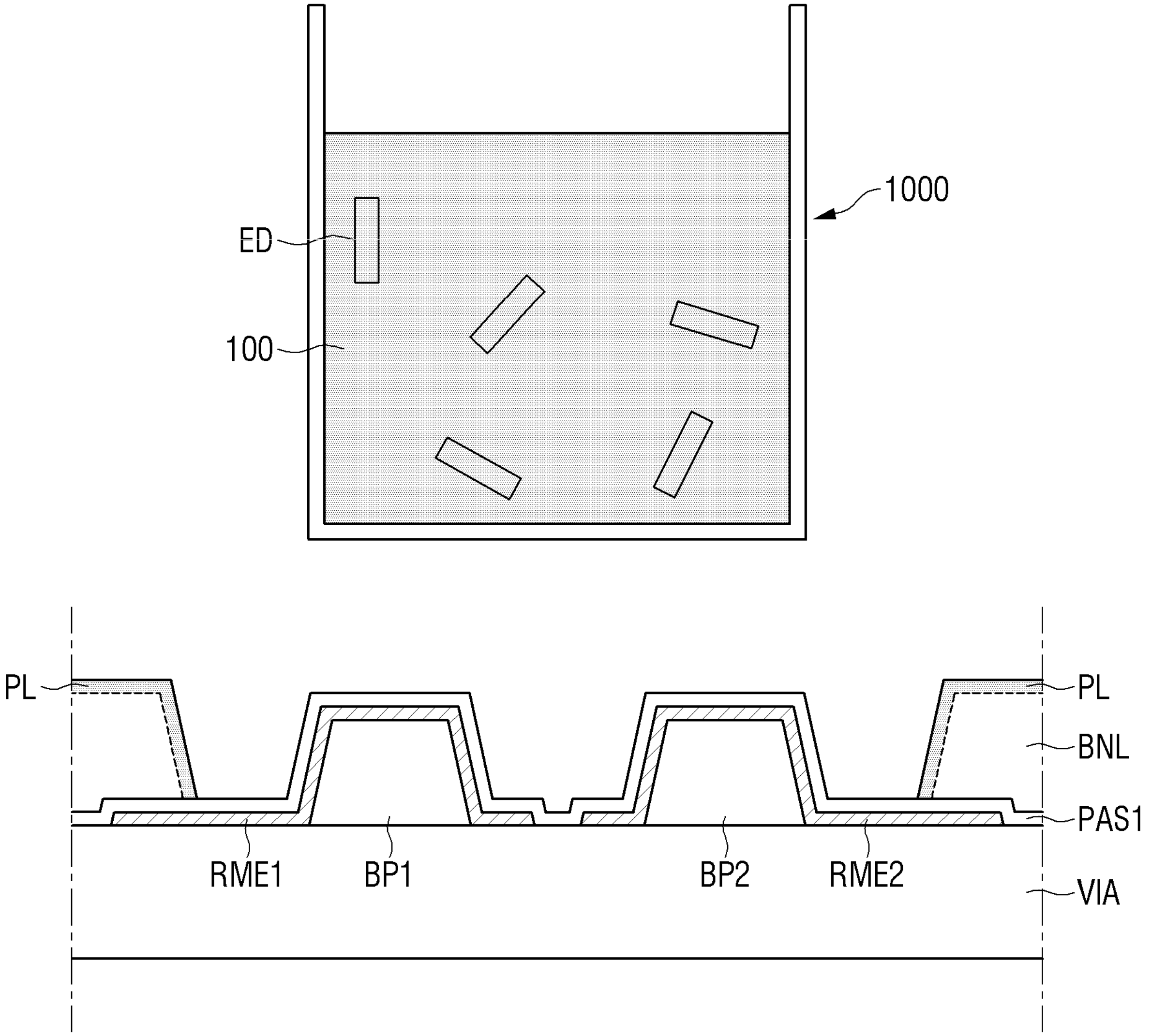
FIGS. 13-18 are cross-sectional views illustrating some of processes of fabricating the display device according to an embodiment.

First, referring to FIG. 13, the light emitting element ink 1000 including the light emitting elements ED and the light emitting element solvent 100 and the substrate on which the first electrode RME1 and the second electrode RME2 are provided are prepared. It has been illustrated in FIG. 13 that the first electrode RME1 and the second electrode RME2 are on the via layer VIA so as to correspond to FIGS. 3-4. The walls BP1 and BP2, the first insulating layer PAS1, and the bank layer BNL may be further on the substrate or the via layer VIA. A description of an arrangement of the walls BP1 and BP2, the electrodes RME1 and RME2, the first insulating layer PAS1, and the bank layer BNL on the via layer VIA is the same as that described above. In one or more embodiments, a plurality of conductive layers, active layers, and/or the like, may be further below the via layer VIA. Hereinafter, for convenience of explanation, these layers will be omitted in the drawings.

The hydrophobic layer PL may be formed by performing the hydrophobic treatment on the surface of the bank layer BNL. The hydrophobic layer PL may have functional groups including fluorine (F) formed thereon, and may have a hydrophobic property. When the light emitting element ink 1000 is jetted onto the area surrounded by the bank layer BNL, the light emitting element ink 1000 may be seated (e.g., deposited) in the area surrounded by the bank layer BNL without overflowing from the bank layer BNL.

Figure 14:
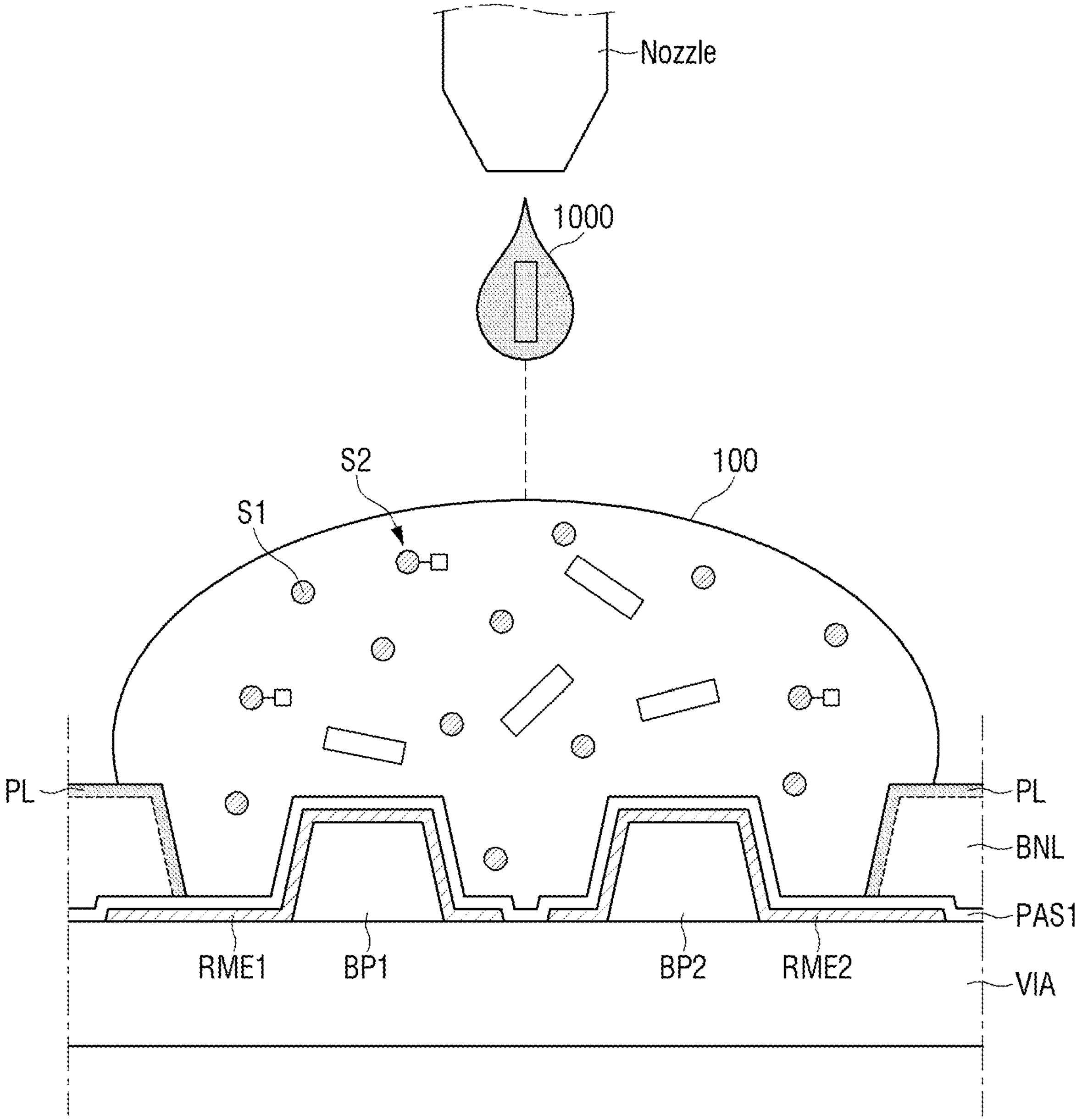

Next, referring to FIG. 14, the light emitting element ink 1000 is jetted onto the area surrounded by the bank layer BNL or the first electrode RME1 and the second electrode RME2. In an embodiment, the light emitting element ink 1000 may be jetted onto the electrodes RME1 and RME2 through the printing process using the inkjet printing device. The light emitting element ink 1000 may be jetted through a nozzle of an inkjet head included in the inkjet printing device. The light emitting element ink 1000 may flow along an inner flow path provided in the inkjet head and may then be discharged onto the substrate through the nozzle.

The light emitting element ink 1000 discharged from the nozzle may be seated (e.g., deposited) on the electrodes RME1 and RME2 on the substrate. The light emitting element ink 1000 may include the light emitting element solvent 100 and the light emitting elements ED dispersed in the light emitting element solvent 100. The light emitting element solvent 100 may include the solvent molecule S1 represented by Formula 1 and the ion remover S2 represented by Formula 2. The light emitting elements ED may have a shape in which they extend in one direction, and may be dispersed in a state in which extension directions thereof within the light emitting element ink 1000 are random orientation directions.

Figure 15:
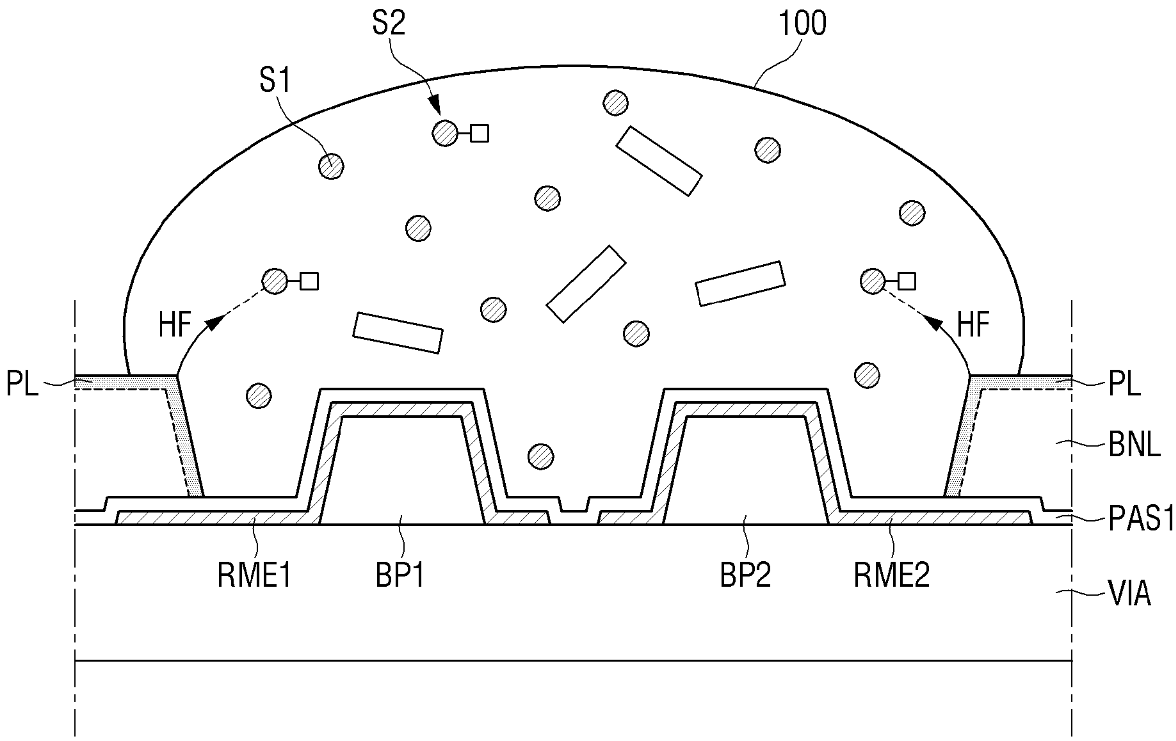
Figure 16:
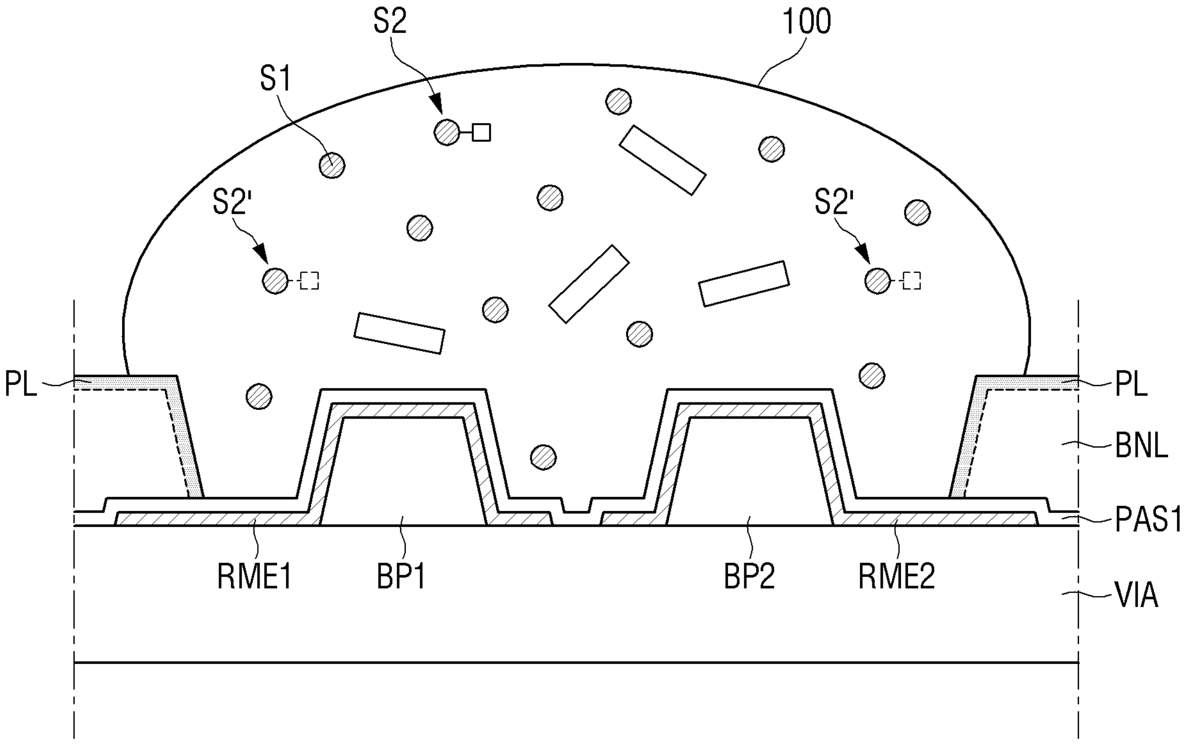

Referring to FIGS. 15-16, when the light emitting element ink 1000 is jetted onto the area surrounded by the bank layer BNL, hydrogen fluoride (HF) including the impurity ions may be eluted from the hydrophobic layer PL of the bank layer BNL. Hydrogen fluoride (HF) may be ionized within the light emitting element solvent 100 to be separated into fluorine ions ($F^-$) and hydrogen ions ($H^+$). In the ion remover S2 included in the light emitting element solvent 100, the silyl group (*—$SiR^2_3$ and '–□' in FIG. 15) may be left while a bond with an ether group ($R^1$—O—* and '●' in FIG. 15) is decomposed, and fluorine ions ($F^-$) may be bound to the silyl group. When the silyl group derived from the ion remover S2 forms a complex with the fluorine ions, a concentration of ions in the light emitting element solvent 100 may not increase, and the light emitting element solvent 100 may have little change in initially designed physical properties, for example, a designed electrical conductivity.

The ion remover S2' in which the silyl group is left may form alcohol that is substantially the same as the solvent molecule S1 of Formula 1 while forming a bond with the hydrogen ions ($H^+$). The ion remover S2 of the light emitting element solvent 100 forms the same alcohol compound as the solvent molecule S1 while removing the fluorine ions ($F^-$), and accordingly, the initially designed physical properties of the light emitting element solvent 100 may not change (or substantially may not change). As further described herein below, the light emitting elements ED dispersed in the light emitting element ink 1000 may be aligned by receiving a dielectrophoretic force by an electric field generated on (or at) the electrodes RME1 and RME2. In this case, the dielectrophoretic force received by the light emitting elements ED may be related to physical properties such as a viscosity, a dielectric constant, and an electrical conductivity of the light emitting element solvent 100.

The light emitting element solvent 100 according to an embodiment includes the ion remover S2 to remove the impurity ions derived from layers, for example, the bank layer BNL, of the display device 10 in the processes of fabricating the display device 10, and a change in physical properties of the light emitting element solvent 100 related to alignment of the light emitting elements ED during the processes of fabricating the display device 10 may be prevented or reduced. Accordingly, the light emitting element ink 1000 may prevent or reduce a decrease in the alignment degree of the light emitting elements ED due to impurities unintentionally generated during the processes of fabricating the display device 10.

Figure 17:
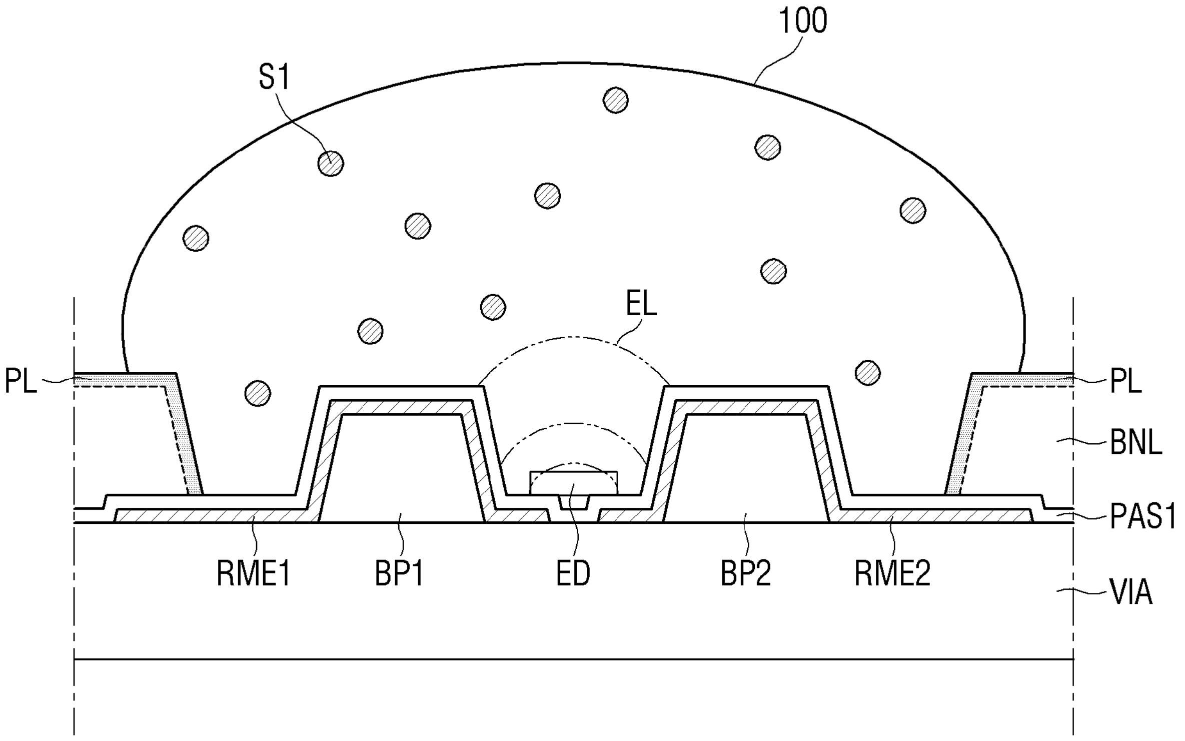

Then, referring to FIG. 17, when the light emitting element ink 1000 including the light emitting elements ED are jetted onto the substrate, an electric field EL is generated by applying alignment signals to the electrodes RME1 and RME2. The light emitting elements ED dispersed in the light emitting element solvent 100 may receive a dielectrophoretic force by the electric field EL, and may be on the electrodes RME1 and RME2 while their orientation directions and positions are changed.

When the electric field EL is generated on (or at) the substrate, the light emitting elements ED may receive the dielectrophoretic force. In some embodiments, when the electric field EL generated on (or at) the substrate is generated in parallel (or substantially in parallel) to an upper surface of the substrate, the light emitting elements ED may be on the first electrode RME1 and the second electrode RME2 in a state in which they are aligned so that extension directions thereof are parallel (or substantially parallel) to the substrate. The light emitting elements ED may move from initially dispersed positions toward the electrodes RME1 and 22 by the dielectrophoretic force. Both ends of the light emitting elements ED may be on the first electrode RME1 and the second electrode RME2, respectively, while positions and orientation directions of the light emitting elements ED are changed by the electric field EL.

Figure 18:
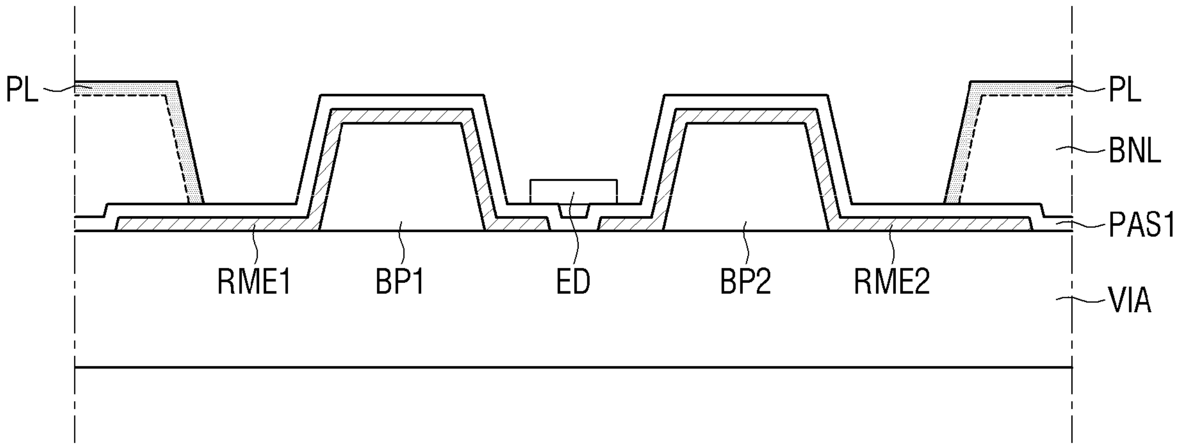

Next, referring to FIG. 18, when the light emitting elements ED are seated (e.g., deposited) on the electrodes RME1 and RME2, the light emitting element solvent 100 of the light emitting element ink 1000 is removed. A process of removing the light emitting element solvent 100 may be performed through a general heat treatment process. In an embodiment, the heat treatment process may be performed in a temperature range of 200° C. to 400° C. or about 300° C. The light emitting element solvent 100 may include the solvent molecule of Formula 1 and the ion remover of Formula 2. However, the ion remover may be included in a trace amount in the light emitting element solvent 100, and in some of the processes of fabricating the display device 10, the silyl group is removed, such that the ion remover may become substantially the same compound as the solvent molecule of Formula 1. The process of removing the light emitting element solvent 100 may be substantially performed under process conditions for removing the compound represented by Formula 1. The solvent molecules represented by Formula 1 may be alcohol compounds, and may have a boiling point within the above temperature range. When the heat treatment process is performed within the above temperature range, it is possible to completely remove the light emitting element solvent 100 while preventing or reducing damage to the light emitting elements ED and circuit elements.

Next, in one or more embodiments, the display device 10 may be fabricated by forming the plurality of insulating layers, the connection electrodes, and/or the like, on the light emitting elements ED and the electrodes RME1 and RME2. Through the above processes, the display device 10 including the light emitting elements ED may be fabricated.

In concluding the detailed description, those skilled in the art will appreciate that many variations and modifications can be made to the disclosed embodiments without substantially departing from the spirit and scope of the present disclosure. Therefore, the disclosed embodiments of the present disclosure are used in a generic and descriptive sense only and not for purposes of limitation.

What is claimed is:

1. A light emitting element ink comprising:

a light emitting element solvent; and light emitting elements dispersed in the light emitting element solvent and each comprising a plurality of semiconductor layers and an insulating film surrounding outer surfaces of the semiconductor layers, wherein the light emitting element solvent comprises a solvent molecule represented by Formula 1 and an ion remover represented by Formula 2, $R^1—(OH)_n$ Formula 1

$R^1—(O—SiR^2_3)_n$ Formula 2 wherein $R^1$ is any one selected from the group consisting of Formulas 3 to 5, $R^2$ is any one selected from the group consisting of hydrogen (H), a $C_1$-$C_{15}$ alkyl group, a $C_2$-$C_{15}$ alkylene group, a $C_2$-$C_{15}$ alkenyl group, a $C_2$-$C_{15}$ alkynyl group, a $C_1$-$C_{15}$ alkyl ether group, a $C_2$-$C_{15}$ alkenyl ether group, and

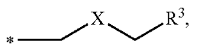

n is an integer of 1 or 2, X is a heteroatom that is any one selected from the group consisting of oxygen (O), nitrogen (N), sulfur(S), and phosphorus (P), $R^3$ is at least one selected from the group consisting of a $C_3$-$C_{13}$ alkyl group, a $C_4$-$C_{13}$ alkylene group, a $C_4$-$C_{13}$ alkenyl group, a $C_4$-$C_{13}$ alkynyl group, a $C_3$-$C_{13}$ alkyl ether group, and a $C_4$-$C_{13}$ alkenyl ether group, and Formula 3

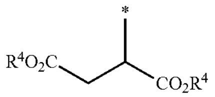

Formula 4

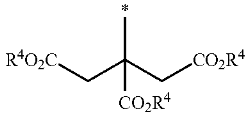

Formula 5

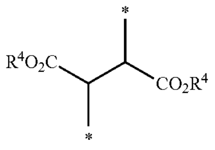

wherein $R^4$ is at least one selected from the group consisting of a $C_1$-$C_{15}$ alkyl group, a $C_2$-$C_{15}$ alkylene group, a $C_2$-$C_{15}$ alkenyl group, a $C_2$-$C_{15}$ alkynyl group, a $C_1$-$C_{15}$ alkyl ether group, and a $C_2$-$C_{15}$ alkenyl ether group, and '*' in Formulas 1 to 5 is a bonding site.

2. The light emitting element ink of claim 1, wherein a viscosity of the light emitting element solvent measured at 25° C. is in a range of 18 cp to 22 cp.

3. The light emitting element ink of claim 1, wherein a dielectric constant of the light emitting element solvent is in a range of 6.4 to 6.6.

4. The light emitting element ink of claim 1, wherein an electrical conductivity of the light emitting element solvent is in a range of 0 to 0.4 μs/m.

5. The light emitting element ink of claim 1, wherein the ion remover is included in an amount of 1 wt % or less with respect to 100 wt % of the light emitting element solvent.

6. The light emitting element ink of claim 1, wherein Formula 1 is any one selected from the group consisting of Formulas A1 to C1, and Formula 2 is any one selected from the group consisting of Formulas A2 to C2, Formula A1

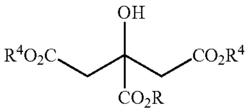

Formula B1

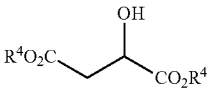

Formula C1

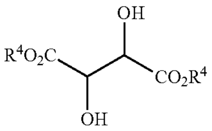

Formula A2

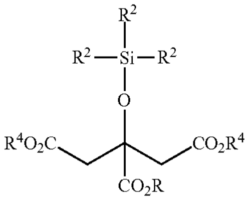

Formula B2

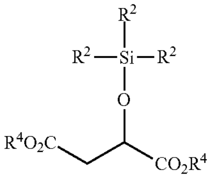

Formula C2

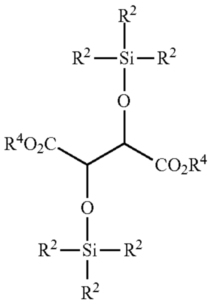

wherein $R^2$ is any one selected from the group consisting of hydrogen (H), a $C_1$-$C_{15}$ alkyl group, a $C_2$-$C_{15}$ alkylene group, a $C_2$-$C_{15}$ alkenyl group, a $C_2$-$C_{15}$ alkynyl group, a $C_1$-$C_{15}$ alkyl ether group, a $C_2$-$C_{15}$ alkenyl ether group, and

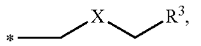

and $R^4$ is any one selected from the group consisting of a $C_1$-$C_{15}$ alkyl group, a $C_2$-$C_{15}$ alkylene group, a $C_2$-$C_{15}$ alkenyl group, a $C_2$-$C_{15}$ alkynyl group, a $C_1$-$C_{15}$ alkyl ether group, and a $C_2$-$C_{15}$ alkenyl ether group.

7. The light emitting element ink of claim 6, wherein the light emitting element solvent comprises each of Formulas A1 to C1 and each of Formulas A2 to C2.

8. The light emitting element ink of claim 6, wherein the light emitting element solvent further comprises at least one selected from the group consisting of compounds represented by Formulas D to F, and

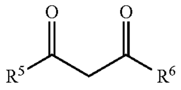

-continued

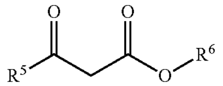

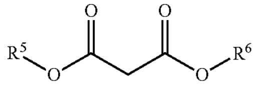

wherein $R^5$ and $R^6$ are each independently any one selected from the group consisting of a $C_1$-$C_{10}$ alkyl group, a $C_2$-$C_{10}$ alkenyl group, a $C_2$-$C_{10}$ alkynyl group, a $C_1$-$C_{10}$ alkyl ether group, and a $C_2$-$C_{10}$ alkenyl ether group.

9. The light emitting element ink of claim 1, wherein the plurality of semiconductor layers comprise a first semiconductor layer and a second semiconductor layer, and a light emitting layer between the first semiconductor layer and the second semiconductor layer, and the insulating film surrounds at least an outer surface of the light emitting layer.

10. The light emitting element ink of claim 9, wherein the light emitting element has a shape in which it extends in one direction and has a length in a range of 1 μm to 5 μm.

* * * * *